United States Patent [19]
Tobita

[11] Patent Number: 6,111,449
[45] Date of Patent: Aug. 29, 2000

[54] CLAMPING CIRCUIT FOR ABSORBING RINGING OF SIGNAL

[75] Inventor: Youichi Tobita, Hyogo, Japan

[73] Assignee: Mitsubishi Denki Kabushiki Kaisha, Tokyo, Japan

[21] Appl. No.: 09/224,999

[22] Filed: Jan. 4, 1999

[30] Foreign Application Priority Data

Jul. 6, 1998 [JP] Japan ................................... 10-190549

[51] Int. Cl.⁷ ................................ H03L 5/00; H03K 5/08
[52] U.S. Cl. ......................... 327/327; 327/313; 327/565; 257/362
[58] Field of Search ................................ 327/313, 327, 327/564, 565; 257/361, 362, 356

[56] References Cited

U.S. PATENT DOCUMENTS 4,577,211  3/1986  Bynum et al. ............................ 357/34
5,158,899  10/1992  Yamagata .................................. 432/27
5,268,588  12/1993  Marum ..................................... 257/362
5,717,354  2/1998  Kim et al. ................................ 327/309

FOREIGN PATENT DOCUMENTS 3-230646  10/1991  Japan.

Primary Examiner—Terry D. Cunningham
Assistant Examiner—Anh-Quan Tra
Attorney, Agent, or Firm—McDermott, Will & Emery

[57] ABSTRACT

In order to reduce the amplitude of an overshoot/undershoot voltage and clamp a signal at a constant voltage level over a wide temperature range, a bias voltage having a clamping element operating at a boundary region between ON and OFF states is applied to a control electrode node of the damping element. When the difference between the voltage of a signal line and the bias voltage is higher than a P-N junction built-in voltage, the clamping element is rendered conductive to clamp the overshoot/undershoot voltage.

19 Claims, 12 Drawing Sheets

FIG. 16
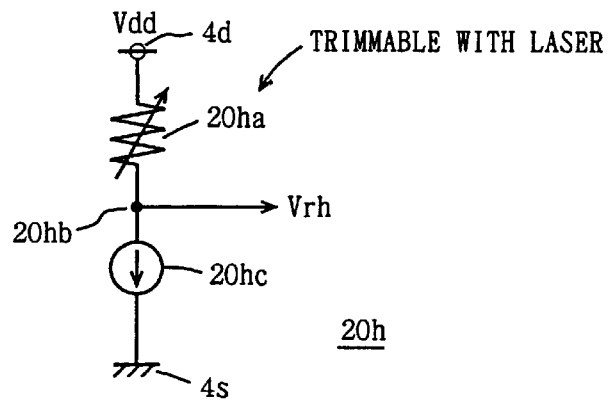
FIG. 17
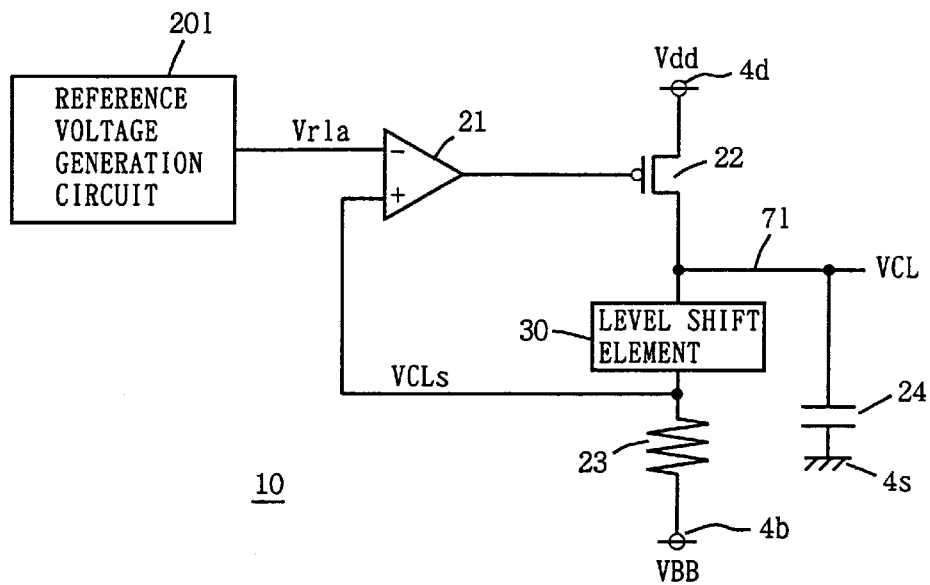
FIG. 18A    FIG. 18B    FIG. 18C
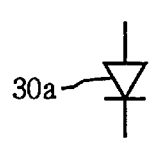 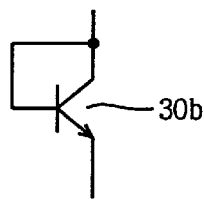 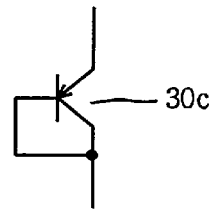

CLAMPING CIRCUIT FOR ABSORBING RINGING OF SIGNAL

BACKGROUND OF THE INVENTION

1. Field of the Invention

The present invention relates to a semiconductor device, and more particularly, it relates to the structure of a clamping circuit for limiting the amplitude of a signal on an input or output signal line coupled to a pad. More specifically, the present invention relates to a circuit for clamping an overshoot voltage and/or an undershoot voltage applied to the pad.

2. Description of the Prior Art

As the operating speed of a semiconductor integrated circuit is increased, the speed for transmitting a signal between such integrated circuits is also increased. In particular, the rise/fall time tr/tf of a digital signal changing between a high level and a low level is reduced when the signal transmission speed is increased. A signal line of a printed circuit board on which the semiconductor integrated circuit is mounted has parasitic inductance and parasitic capacitance. When a signal having a short rise/fall time tr/tf is transmitted, therefore, the current change ratio di/dt is increased to increase an overshoot/undershoot voltage of the signal on the line on the printed circuit board. Following this overshoot/undershoot, oscillation of the signal is caused on an LC circuit formed by the parasitic inductance and the parasitic capacitance, to result in ringing. When the overshoot/undershoot voltage increases and the amplitude of this ringing increases to exceed the input logical threshold of an input stage of a next stage circuit or a receiving circuit, a false signal is generated to cause spurious switching of the next stage circuit or the receiving circuit, resulting in a circuit malfunction. Further, the state of the signal cannot be determined until the ringing is stabilized, and hence high-speed signal transmission cannot be implemented.

When electrons are injected into a substrate region of a dynamic random access memory (DRAM) by a large overshoot/undershoot voltage and the injected electrons are stored in a storage node storing information of a memory cell, the data stored in the memory cell disappears to cause a soft error. When the potential of the substrate region changes, further, the threshold voltage of an insulated gate field effect transistor (MOS transistor) of a component of DRAM changes responsively to cause deviation in operation timing and to reduce an operation margin.

FIG. 33 schematically illustrates the arrangement of a plurality of integrated circuits mounted on a printed circuit board. Referring to FIG. 33, integrated circuits 100a to 100n, such as memory LSIs, are coupled in common to a transmission line 102 transmitting a signal. The transmission line 102 is connected with the integrated circuits 100a to 100n through branch lines 107a to 107n at branch points 106a to 106n respectively. The transmission line 102 is provided with a driver circuit 104 for transmitting a signal from a processor or a logic circuit (not shown).

In the system shown in FIG. 33, ringing on the transmission line 102 must be suppressed by matching the output impedance of the driver circuit 104 with the characteristic impedance of the transmission line 102. However, the drivability of the driver circuit 104 is increased for increasing the operating speed of the system. The output impedance of the driver circuit 104 is generally reduced for increasing the drivability thereof. Thus, the output impedance of the driver circuit 104 is mismatched with the characteristic impedance of the transmission line 102, and an overshoot/undershoot is apt to be caused.

In order to suppress reflection of the signal from an end point 108, a resistive element (terminating resistance) having the same resistance value as the characteristic impedance of the transmission line 102 may be provided between the end point 108 and a voltage source (e.g., a ground node) supplying a constant voltage. When such terminating resistance is provided, however, a current flows through the resistance to increase power consumption of the whole system.

The transmission line 102 is connected to the integrated circuits 100a to 100n through the branch lines 107a to 107n at the branch points 106a to 106n respectively. In each of the integrated circuits 100a to 100n, each of the branch lines 107a to 107n is connected to a gate electrode of an input MOS transistor (if the integrated circuit is a MOS integrated circuit). The gate electrode of the MOS transistor, which is isolated from a source/drain by a gate insulation film, has high resistance against an input signal. In other words, the integrated circuits 100a to 100n have high input impedances to the branch lines 107a to 107n. This state is equivalent to open states of the branch lines 107a to 107n as viewed from the branch points 106a to 106n, and input parts of the integrated circuits 100a to 100n reflect the signal transmitted from the branch points 106a to 106n, to readily cause an overshoot/undershoot on the signal on the transmission line 102.

Influence by such an overshoot/undershoot and subsequent ringing remarkably increases particularly when the amplitude of the signal transmitted through the transmission line 102 is reduced. In order to suppress such an overshoot/undershoot of the signal, a clamping circuit employing a diode element may be provided on each of the integrated circuits 100a to 100n for suppressing an overshoot/undershoot voltage.

FIG. 34 illustrates an exemplary structure of a conventional clamping circuit provided on an input part of an integrated circuit. Referring to FIG. 34, a diode element 113 is connected between an internal input line 111 connected to a bonding pad 110 and a power supply node 112, and another diode element 115 is connected between the input line 111 and a ground node 114. A resistor 116 for current limitation is provided between the input line 111 and an invertor 117 which is an internal circuit. The pad 110 is connected to an external terminal through a bonding wire. The diode element 113 is connected in the forward direction from the signal input line 111 to the power supply node 112, and the diode element 115 is connected in the reverse direction from the input line 111 to the ground node 114.

When a voltage lower than the ground voltage is applied to the input line 111 through the pad 110, the diode element 115 is rendered conductive to supply a current from the ground node 114 to the input line 111 for clamping the undershoot voltage at the ground voltage level. When an overshoot voltage higher than a power supply voltage Vcc is applied to the input line 111 through the pad 110, the diode element 113 is rendered conductive to clamp the overshoot voltage at the level of the power supply voltage Vcc.

Thus, the clamping circuit clamps the overshoot/undershoot voltage on the input line 111, for preventing the invertor 117 of an internal circuit from malfunctioning while preventing the internal circuit 117 from being suffered from electrostatic breakdown due to application of a large electrostatic voltage to the pad 110 with the resistor 116.

Each of the diode elements 113 and 114 has a built-in voltage (contact potential) across a P-N junction and is rendered conductive when a voltage larger than the built-in voltage is applied in the forward direction. In general, this voltage is referred to as a forward voltage drop Vf. As shown in FIG. 35, therefore, an overshoot voltage of a signal IN on the input line 111 is clamped at a voltage Vcc+Vf while an undershoot voltage is clamped at a voltage Vss−Vf (=−0.7 V). This state is implemented when the diode element 113 or 115 ideally responds at a high speed for clamping the overshoot/undershoot voltage. In practice, however, the absolute value of the clamping voltage for the input signal IN on the input line 111 is greater than that of the ideal clamping voltage due to a delay in response resulting from switching characteristics of the diode element 113 or 115. When the power supply voltage Vcc is at a low level of 2.0 or 2.5 V, the value of the forward voltage drop Vf cannot be neglected and the reliability of the internal circuit (invertor) 117 cannot be sufficiently guaranteed.

When a waveform exceeding the input logical threshold voltage of the internal circuit (invertor) 117 is present on ringing following such an overshoot/undershoot, the invertor 117 performs a switching operation and an internal signal is unstabilized. Particularly when the power supply voltage Vcc lowers, the amplitude of the ringing relatively increases to cause spurious switching of the internal circuit (invertor) 117 and the internal signal from the internal circuit (invertor) 117 is unstabilized to increase the possibility of a malfunction.

The problem of the overshoot/undershoot on the input line 111 similarly takes place also where the pad 110 is an output pad. When an output buffer of the integrated circuit outputs a signal at a high speed, an output signal line is charged/discharged at a high speed. In this case, an overshoot/undershoot is similarly caused on the signal due to presence of large parasitic inductance and parasitic capacitance on the pad, a bonding wire, an external pin terminal and such. In this case, a signal having an overshoot/undershoot is transmitted through the transmission line 102 receiving a data signal from the integrated circuit, to result in a malfunction in a receiving circuit. Further, the receiving circuit cannot produce an internal signal until the signal is defined, and hence high-speed signal transfer cannot be performed.

When employing a diode element as a clamping element, the built-in voltage of a P-N junction part thereof has temperature dependency that the built-in voltage reduces as the temperature rises. When driving the semiconductor integrated circuit in a low temperature region, therefore, the absolute value of the clamping level increases, the internal circuit cannot be sufficiently protected, and the signal amplitude cannot be sufficiently suppressed.

SUMMARY OF THE INVENTION

An object of the present invention is to provide a semiconductor device which can reliably suppress an overshoot/undershoot voltage.

Another object of the present invention is to provide a semiconductor device which can suppress an overshoot/undershoot at a high speed.

Still another object of the present invention is to provide a semiconductor device which can reliably suppress an overshoot/undershoot at a high speed over a wide temperature region.

Briefly stated, the present invention employs a lateral bipolar transistor as a clamping element and sets a base voltage of the bipolar transistor depending on the level of a clamping voltage.

An overshoot/undershoot voltage can be absorbed at a high speed by forming a clamping transistor with a lateral bipolar transistor structure (due to a collector current). Further, the clamping voltage can be set at an optimum level by a bias voltage.

When a diode element having the same structure as the clamping transistor is utilized in a bias voltage generation circuit, contribution of a built-in voltage to a voltage for the clamping transistor to start conducting can be canceled by a forward voltage drop of the diode element, so that the clamping voltage level can be set independently of the built-in voltage with no influence from the built-in voltage and can be held at a constant value over a wide operating range.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 illustrates an exemplary structure of the reference voltage generation circuit shown in FIG. 15;

FIG. 17 schematically illustrates the structure of a main part of a semiconductor device according to an embodiment 6 of the present invention;

FIGS. 18A to 18C illustrate exemplary structures of a level shift element shown in FIG. 17;

DESCRIPTION OF THE PREFERRED EMBODIMENTS

[Overall Structure]

Figure 1:
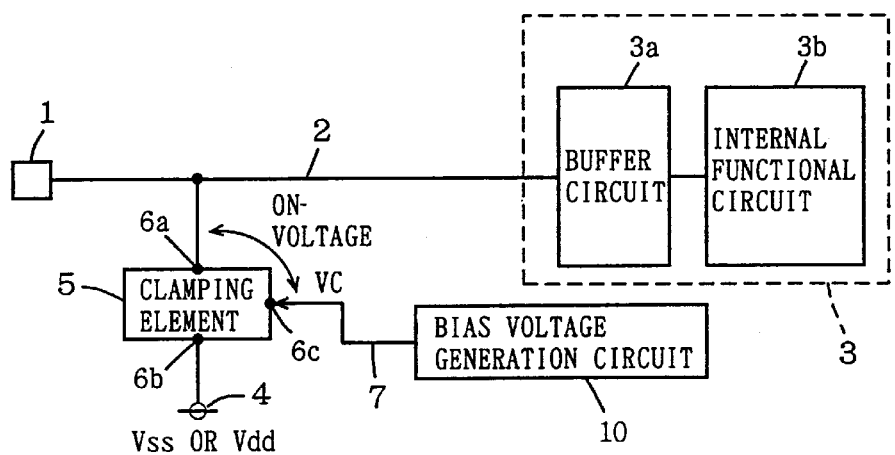
FIG. 1 schematically illustrates the overall structure of a semiconductor device according to the present invention.

FIG. 1 schematically illustrates the overall structure of a semiconductor device according to the present invention. Referring to FIG. 1, an internal circuit 3 is coupled to a pad 1 through a signal line 2. The internal circuit 3 includes an internal functional circuit 3b performing a prescribed function and a buffer circuit 3a for transferring a signal between the internal circuit 3 and an external device. The internal circuit 3 may be an input circuit, an output circuit, or an input/output circuit. In other words, the buffer circuit 3a may be an input buffer for buffering a signal supplied to the pad 1 and forming an internal signal or an output buffer for buffering an internal output signal formed in the internal functional circuit 3b for outputting through the pad 1, or may include both input and output buffers.

The semiconductor device further includes a three-terminal clamping element 5 having a first conduction node 6a connected to the signal line 2, a second conduction node 6b coupled to a power source node 4 and a control node 6c receiving a bias voltage VC from a bias voltage generation circuit 10. An overshoot/undershoot voltage of the signal line 2 can be absorbed at a high speed due to amplification of the clamping element 5 formed of a three-terminal element. The power supply node 4 is supplied with a ground voltage Vss or a power source voltage Vdd. The bias voltage generation circuit 10 generates the bias voltage VC depending on the clamping level of the clamping element 5.

Figure 2:
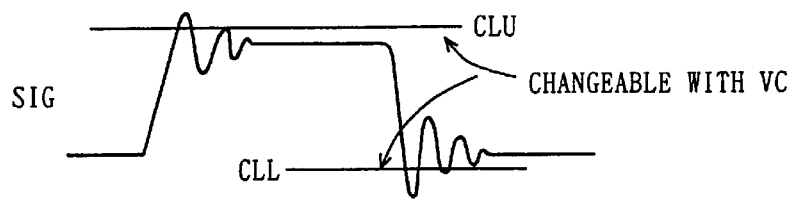
FIG. 2 is a signal waveform diagram respecting operations of a clamping element shown in FIG. 1.

The voltage level on the signal line 2 at which the clamping element 5 starts conducting can be changed by employing the bias voltage generation circuit 10. As shown in FIG. 2, the levels of clamping voltages CLU and CLL for clamping overshoot and undershoot voltages of a signal SIG on the signal line 2 can be set at optimum values. The clamping voltage CLU is the clamping level for the overshoot voltage, and the clamping voltage CLL is that for the undershoot voltage. Thus, clamping voltage levels having smaller absolute values than those of clamping voltages by a general diode element can be implemented, resulting in suppression of an overshoot and an undershoot, suppression of ringing accordingly and prevention of occurrence of a spurious component.

[Embodiment 1]

Figure 3A:
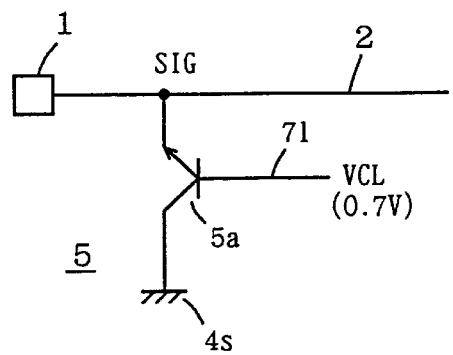
FIG. 3A illustrates the structure of a main part of a semiconductor device according to an embodiment 1 of the present invention.
Figure 3B:
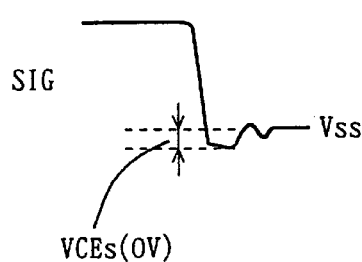
FIG. 3B is an operation waveform diagram thereof.

FIG. 3A illustrates the structure of a main part of a semiconductor device according to an embodiment 1 of the present invention, and shows the structure of a clamping element 5. The clamping element 5 is formed of an npn bipolar transistor 5a having an emitter coupled to a signal line 2, a collector connected to a ground node 4s and a base electrode (control electrode node) receiving a bias voltage VCL through a bias voltage transmission line 71. The bias voltage VCL is set at 0.7 V, for example. This bias voltage VCL is equal to a base-to-emitter built-in voltage of the npn bipolar transistor 5a. Operations of the clamping element 5 shown in FIG. 3A are now described with reference to a signal waveform diagram shown in FIG. 3B.

When a signal SIG on the signal line 2 is at a higher level than the bias voltage VCL, the npn bipolar transistor 5a maintains an OFF state since the base to emitter thereof is biased in the reverse direction. Therefore, the signal SIG supplied from a pad 1 or an internal circuit 3 to the signal line 2 is transmitted to the internal circuit 3 (see FIG. 1) or an external device with no influence from the bipolar transistor 5a.

When the signal SIG on the signal line 2 lowers to a negative voltage level, the npn bipolar transistor 5a has the base to emitter biased in the forward direction became conductive for clamping the signal SIG on the signal line 2 at the level (about 0 V) of a collector-to-emitter saturation voltage VCEs thereof. The absolute value of the clamping voltage can be remarkably reduced as compared with a clamping voltage of −0.7 V implemented by a diode element, and the internal circuit 3 or a receiving circuit can be stably driven. Since the undershoot voltage has a small absolute value, the amplitude of ringing following the undershoot is also small, no spurious switching takes place in a buffer circuit 3a (in case of an input buffer circuit) and an internal functional circuit 3b can stably operate. When the buffer circuit 3a is an output buffer, ringing of a signal transmitted to a transmission line through the pad 1 is small and the signal can be stably transmitted at a high speed.

Figure 4:
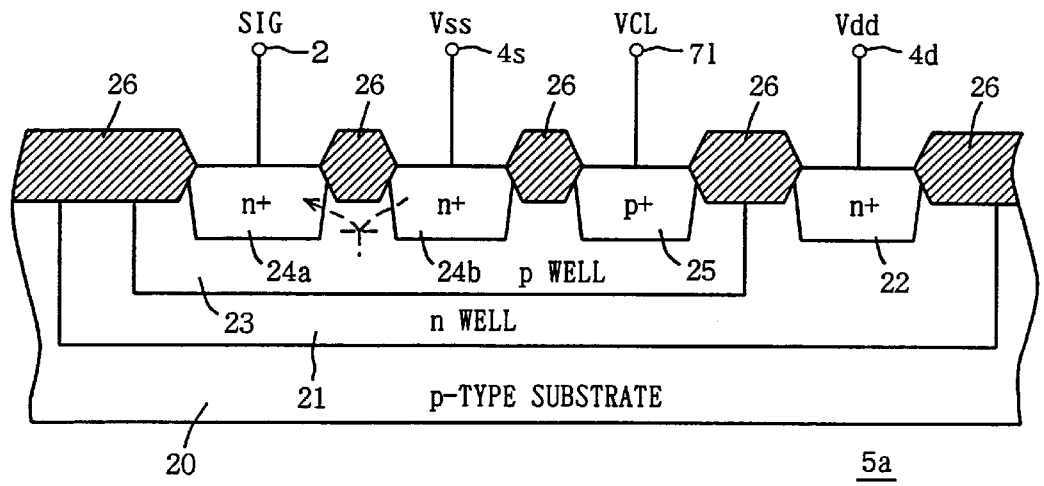
FIG. 4 schematically illustrates the sectional structure of a clamping transistor shown in FIG. 3A.

FIG. 4 schematically illustrates the cross sectional structure of the npn bipolar transistor 5a shown in FIG. 3A. Referring to FIG. 4, an n-type well (n well) 21 is formed on a surface of a p-type semiconductor substrate 20. The n well 21 is coupled to a power supply node 4d through a high-concentration n-type impurity region 22, and biased at the level of a power supply voltage Vdd.

A p well (p-type well) 23 is formed on a surface of then well 21. The p well 23 is coupled to the bias voltage transmission line 71 through a high-concentration p-type impurity region 25, and biased at the level of the bias voltage VCL. High-concentration n-type impurity regions 24a and 24b are formed spaced apart from each other on a surface of the p well 23. The impurity region 24a is coupled to the signal line 2 and receives the signal SIG. The impurity region 24b is coupled to the ground node 4s and receives a ground voltage Vss. Thick element isolation films (field oxide) 26 are arranged between the impurity regions 24a, 24b and 25.

The npn bipolar transistor 5a is formed by the p well 23 and the impurity regions 24a, 24b and 25. The impurity region 24a functions as an emitter, and the impurity region 24b functions as a collector. The p well 23 functions as a base. The impurity region 24a coupled to the signal line 2 and the impurity region 24b coupled to the ground node 4s are adjacently arranged within the element isolation film 26 placed therebetween, so that a current readily flows between the signal line 2 and the ground node 4s when a lateral bipolar transistor is rendered conductive. The region between the impurity regions 24a and 24b functions as a base region, and the lateral npn bipolar transistor operates at a high speed due to the short length of the base region.

When the lateral bipolar transistor is rendered conductive in the transistor structure shown in FIG. 4, a vertical bipolar transistor formed by the impurity region 24a, the p well 23 and the n well 21 is rendered conductive (due to avalanche breakdown caused in the lateral bipolar transistor when the signal SIG on the signal line 2 remarkably changes in the negative direction). In this case, the n well 21 transmits a collector current from the power supply node 4d through the impurity region 22 to the impurity region 24a through the p well 23. The p well 23 to the n well 21 is held in reverse-biased state by the voltages VCL and Vdd, and hence a flow of a large current is suppressed. Therefore, a clamping operation with the lateral bipolar transistor becomes predominant. When the depth of the p well 23 is sufficiently increased, influence by the vertical bipolar transistor can be suppressed since the length of the base thereof is increased.

In case of the triple well structure with the n well 21 and the p well 23 formed on the p-type substrate 20, a current flows in the p well 23 or merely flows in the n well 21 at the worst during an operation of the bipolar transistor 5a, and an adverse influence on another circuit region is suppressed. The n well 21 and the p well 23 can be formed respectively in parallel in steps of fabricating a MOS transistor of the internal circuit 3, and the clamping element 5 can be formed with no additional step when the internal circuit 3 is a MOS circuit.

[Modification 1]

Figure 5A:
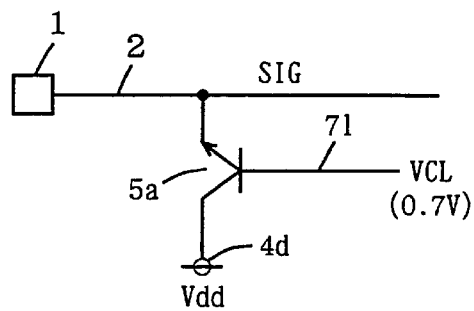
FIG. 5A schematically illustrates the structure of a modification 1 of the embodiment 1 of the present invention.
Figure 5B:
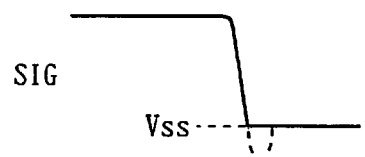
FIG. 5B is a signal waveform diagram showing operations of the circuit shown in FIG. 5A.

FIG. 5A illustrates the structure of a modification 1 of the embodiment 1 of the present invention. Referring to FIG. 5A, a collector of an npn bipolar transistor 5a is connected to a power supply node 4d. The remaining structure of this modification is identical to that shown in FIG. 3A, and corresponding parts are denoted by the same reference numerals. In the structure of a clamping element shown in FIG. 5A, the npn bipolar transistor 5a is rendered conductive when a signal SIG on a signal line 2 is at a negative voltage, to supply a current from the power supply node 4d to the signal line 2, as shown in FIG. 5B. A bias voltage VCL of 0.7 V is transmitted to a base of the npn bipolar transistor 5a through a bias voltage transmission line 71. When the voltage on the signal line 2 exceeds a ground voltage due to a collector current, therefore, the base to emitter of the npn bipolar transistor 5a is biased in the reverse direction and hence the npn bipolar transistor 5a enters an OFF state. When the npn bipolar transistor 5a shown in FIG. 5A is employed as a clamping element, therefore, a clamping voltage for an undershoot of the signal SIG on the signal line 2 is at the level of a ground voltage Vss (the base-to-emitter built-in voltage is assumed to be 0.7 V).

When the clamping element shown in FIG. 5A is employed, therefore, an undershoot can be reliably avoided for preventing application of an unnecessary overvoltage to an internal circuit.

[Modification 2]

Figure 6A:
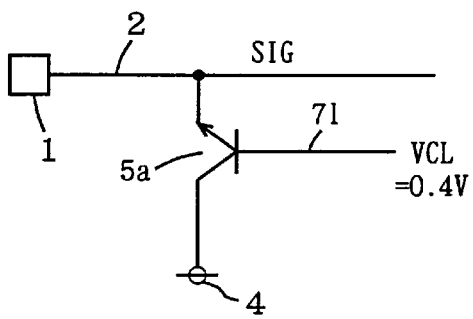
FIG. 6A illustrates the structure of a modification 2 of the embodiment 1 of the present invention.

FIG. 6A illustrates the structure of a modification 2 of the embodiment 1 of the present invention. Referring to FIG. 6A, a bias voltage VCL of 0.4 V is applied. The remaining structure of this modification is identical to that shown in FIG. 3A. Referring to FIG. 6A, a collector of an npn bipolar transistor 5a may receive either a power supply voltage Vdd or a ground voltage Vss from a power supply/ground (source) node 4.

Figure 6B:
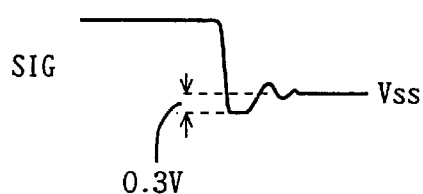
FIG. 6B illustrates an operation waveform thereof.

When the bias voltage VCL is 0.4 V as shown in FIG. 6A and a signal SIG on a signal line 2 is −0.3 V as shown in FIG. 6B, the base to emitter of the bipolar transistor 5a is biased in the forward direction and the bipolar transistor 5a is rendered conductive to start a clamping operation. In this case, the voltage of the power source node 4 is higher than that on the signal line 2, and hence the clamping voltage level is −0.3 V regardless of whether the power source node 4 supplies the ground voltage Vss or the power supply voltage Vdd.

When an operating temperature rises and the base-to-emitter built-in voltage of the npn bipolar transistor 5a lowers, there is a possibility that a large leakage current flows to increase current consumption and in addition the voltage level of the signal SIG rises to cause a circuit malfunction even when the signal SIG on the signal line 2 is at the level of the ground voltage Vss. If the bias voltage VCL is set lower than the built-in voltage as shown in FIG. 6A, the undershoot clamping voltage is not increased beyond the ground voltage Vss in temperature rising. When the voltage of the signal SIG is at the level of the ground voltage Vss, the npn bipolar transistor 5a can be turned off for reducing current consumption with no undershoot, and unnecessary reduction of the amplitude of the signal SIG can be prevented.

As hereinabove described, the embodiment 1 of the present invention fixing the base voltage of an npn bipolar transistor at a constant bias voltage level can clamp a signal on a signal line at the level of a voltage lower in absolute value than a voltage with a diode element, reduce the amplitude of an undershoot voltage, suppress a malfunction of an internal circuit (receiving circuit) and ringing over a long time period, and stably transmit the signal at a high speed.

[Embodiment 2]

Figure 7A:
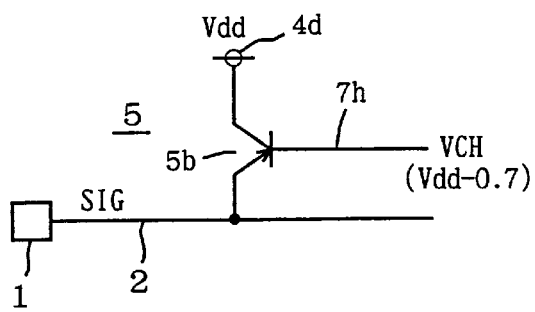
FIG. 7A illustrates the structure of a main part of a semiconductor device according to an embodiment 2 of the present invention.

FIG. 7A illustrates the structure of a main part of a semiconductor device according to an embodiment 2 of the present invention. Referring to FIG. 7A, a clamping element 5 is formed of a pnp bipolar transistor 5b coupled between a power supply node 4d and a signal line 2 and receiving a bias voltage VCH on its base through a bias voltage transmission line 7h. The bias voltage VCH is at the level of a power supply voltage Vdd−0.7 V. It is assumed that the base-to-emitter built-in voltage of the pnp bipolar transistor 5b is 0.7 V.

Figure 7B:
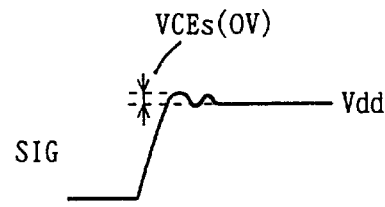
FIG. 7B illustrates a signal waveform thereof.

Operations of the clamping element 5 shown in FIG. 7A are now described with reference to a signal waveform diagram shown in FIG. 7B.

When the voltage of a signal SIG on the signal line 2 is lower than the power supply voltage Vdd, the emitter-to-base voltage of the pnp bipolar transistor 5b is lower than the built-in voltage and the pnp bipolar transistor 5b is in an OFF state. When the voltage of the signal SIG on the signal line 2 exceeds the power supply voltage Vdd, the base to emitter of the pnp bipolar transistor 5b is biased in the forward direction beyond the built-in voltage. Thus, a collector current flows in the pnp bipolar transistor 5b and the voltage between the power supply node 4d and the signal line 2 reaches a level substantially identical to the collector-to-emitter saturation voltage (about 0 V) of the bipolar transistor 5b. Therefore, a clamping voltage against an overshoot of the signal SIG on the signal line 2 is substantially equal to the power supply voltage Vdd. The amplitude of the overshoot voltage can be reduced as compared with that with a general diode element, a stable operation of an internal circuit (input buffer) or a receiving circuit (when the internal circuit is an output circuit) can be implemented, the duration of ringing can be reduced due to the reduction of the amplitude of the overshoot voltage, and high-speed signal transmission is implemented.

Figure 8:
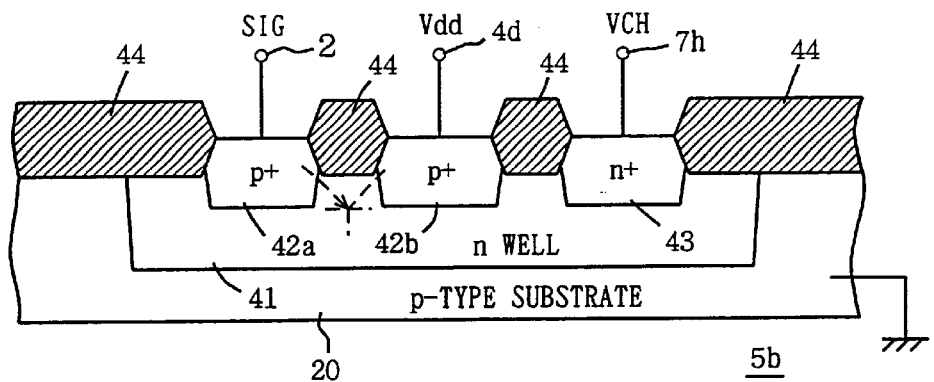
FIG. 8 schematically illustrates the sectional structure of a clamping transistor shown in FIG. 7A.

FIG. 8 schematically illustrates the cross sectional structure of the pnp bipolar transistor 5b shown in FIG. 7A. Referring to FIG. 8, an n well 41 is formed on a surface of a p-type substrate 20. High-concentration p-type impurity regions 42a and 42b are formed on a surface of the n well 41 adjacently with an element isolation film 44 placed therebetween. A high-concentration n-type impurity region 43 is formed adjacently to the impurity region 42b with another element isolation film 44 placed therebetween. The impurity region 42a is coupled to the signal line 2 for receiving the signal SIG, while the impurity region 42b is coupled to the power supply node 4d for receiving the power supply voltage Vdd. The impurity region 43 receives the bias voltage VCH through the bias voltage transmission line 7h. The n well 41 functions as a base of the pnp bipolar transistor 5b, and the impurity regions 42a and 42b function as an emitter and a collector of the pnp bipolar transistor 5b respectively.

In the structure shown in FIG. 8, the impurity region 42a coupled to the signal line 2 and the impurity region 42b coupled to the power supply node 4d are arranged adjacently to each other, for reducing the length of the base of a lateral pnp bipolar transistor, implementing high-speed response, making a flow of a current between the impurity regions 42a and 42b easy to cause, i.e., suppressing a flow of the current into a bias voltage generation circuit through the bias voltage transmission line 7h, and stabilizing the circuit operation.

In the structure shown in FIG. 8, a current flows from the impurity region 42a to the impurity region 42b when the signal SIG on the signal line 2 goes high because the n well 41 biased at the bias voltage VCH through the impurity region 43 and the impurity regions 42a and 42b form the lateral pnp bipolar transistor shown by broken lines. On the other hand, the impurity region 42a, the n well 41 and the p-type substrate 20 form a vertical pnp bipolar transistor. The p-type substrate 20 is biased at the ground voltage level (or may be biased at a negative voltage). While a current flows to the p-type substrate 20 when the vertical pnp bipolar transistor operates, the p-type substrate 20 having larger parasitic capacitance than that of the n well 41 can stably absorb the current for preventing adverse influence on another circuit. In order to prevent the vertical pnp bipolar transistor from operating, the depth of the n well 41 may be sufficiently increased for inhibiting the current from flowing into the p-type substrate 20 by an operation of the vertical bipolar transistor when the lateral bipolar transistor operates.

[Modification 1]

Figure 9A:
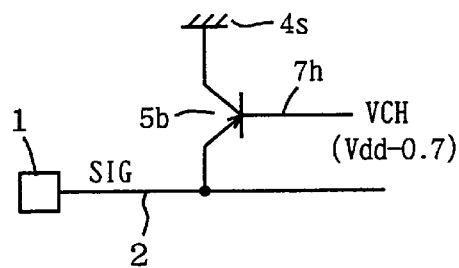
FIG. 9A illustrates the structure of a modification 1 of the embodiment 2 of the present invention.

FIG. 9A illustrates the structure of a modification 1 of the embodiment 2 of the present invention. In the structure shown in FIG. 9A, a collector of a pnp bipolar transistor 5b is coupled to a ground node 4s. The remaining structure of this modification 1 is identical to that shown in FIG. 7A, and corresponding parts are denoted by the same reference numerals.

Figure 9B:
FIG. 9B illustrates a signal waveform thereof.

When the voltage of a signal SIG on a signal line 2 exceeds a power supply voltage Vdd in the structure shown in FIG. 9A, the pnp bipolar transistor 5b is rendered conductive and a current flows from the signal line 2 to the ground node 4s. As shown in a signal waveform diagram of FIG. 9B, therefore, a clamping voltage for an overshoot voltage of the signal SIG is at the level of the power supply voltage Vdd, and generation of the overshoot voltage can be reliably suppressed.

[Modification 2]

Figure 10A:
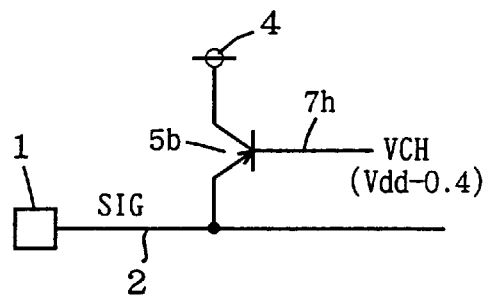
FIG. 10A illustrates the structure of a modification 2 of the embodiment 2 of the present invention.

FIG. 10A illustrates the structure of a modification 2 of the embodiment 2 of the present invention. In the structure shown in FIG. 10A, a bias voltage VCH is set at the level of Vdd−0.4 V. A collector of a pnp bipolar transistor 5b, which can be connected to either a power supply node or a ground node, is connected to a power source node 4 in FIG. 10A. The remaining structure of this modification 2 is identical to that shown in FIG. 7A or 9A.

Figure 10B:
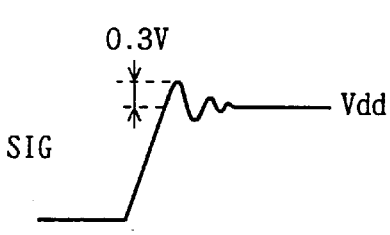
FIG. 10B illustrates a signal waveform thereof.

In the structure shown in FIG. 10A, the base to emitter of the pnp bipolar transistor 5b is biased in the forward direction beyond a built-in voltage and the pnp bipolar transistor 5b is rendered conductive when a signal SIG on a signal line 2 reaches a level of Vdd+0.3 V. In this case, therefore, the clamping voltage for an overshoot of the signal SIG on the signal line 2 is at the level of Vdd+0.3 V as shown in FIG. 10B, regardless of whether the power source node 4 supplies a ground voltage or a power supply voltage. Even when the absolute value of the base-to-emitter built-in voltage of the pnp bipolar transistor 5b is reduced by temperature rising and the signal SIG reaches the level of the power supply voltage Vdd, a leakage current can be suppressed and current consumption can be reduced. Further, a high level of the signal SIG can be prevented from lowering below the power supply voltage Vdd due to reduction of the built-in voltage of the pnp bipolar transistor 5b in this temperature rising. Thus, the signal SIG can be stably transmitted. The amplitude of the overshoot voltage is sufficiently reduced as compared with that by a diode element.

As hereinabove described, the embodiment 2 of the present invention employing a pnp bipolar transistor as a clamping element and adjusting a bias voltage for the base thereof can reliably suppress the amplitude of an overshoot voltage of a signal on a signal line. Further, the overshoot voltage can be absorbed at a high speed by current amplification due to the employment of the bipolar transistor, and a clamping element having high-speed responsibility can be implemented.

[Embodiment 3]

Figure 11A:
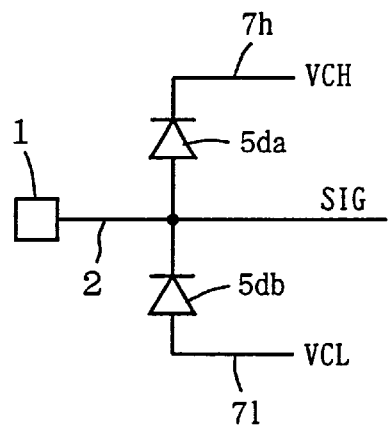
FIG. 11A schematically illustrates the structure of a main part of a semiconductor device according to an embodiment 3 of the present invention.

FIG. 11A schematically illustrates the structure of a semiconductor device according to an embodiment 3 of the present invention. Referring to FIG. 11A, the semiconductor device includes a diode element 5da for absorbing an overshoot voltage of a signal SIG on a signal line 2 and a diode element 5db for absorbing an undershoot voltage. The diode element 5da has an anode connected to the signal line 2 and a cathode coupled to a bias voltage transmission line 7h for receiving a bias voltage VCH. The diode element 5db has a cathode connected to the signal line 2 and an anode receiving a bias voltage VCL through a bias voltage transmission line 71.

Figure 11B:
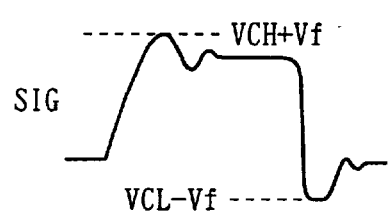
FIG. 11B illustrates a signal waveform thereof.

In the structure shown in FIG. 11A, the upper limit of the signal SIG is set at VCH+Vf while the lower limit thereof is set at VCL-Vf, where Vf represents a forward voltage drop (built-in voltage of a P-N junction) of the diode elements 5da and 5db. Therefore, a clamping voltage for an overshoot of the signal SIG is VCH+Vf and that for an undershoot is VCL-Vf, as shown in FIG. 11. The amplitude of the overshoot/undershoot voltage can be reduced by setting the bias voltages VCH and VCL at appropriate values.

[Modification]

Figure 12:
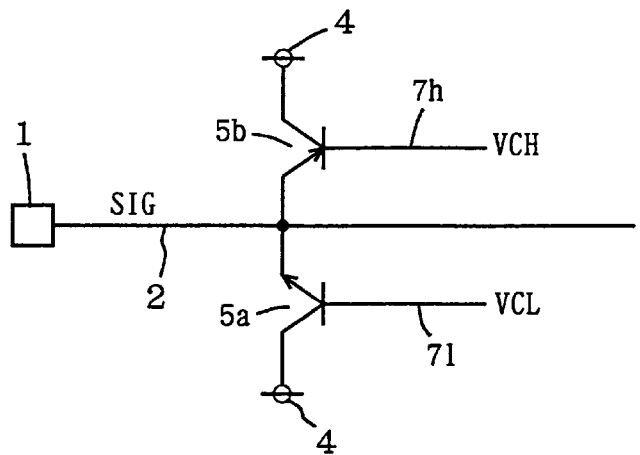
FIG. 12 illustrates the structure of a modification of the embodiment 3 of the present invention.

FIG. 12 illustrates the structure of a modification of the embodiment 3 of the present invention. Referring to FIG. 12, an npn bipolar transistor 5a for clamping an undershoot voltage and a pnp bipolar transistor 5b for clamping an overshoot voltage are connected to a signal line 2. These bipolar transistors 5a and 5b are identical to the bipolar transistor coupled to the power source node 4 shown in each of the embodiments 1 and 2. Therefore, an overshoot and an undershoot of a signal SIG on a signal line 2 can be reliably suppressed by employing the structure shown in FIG. 12.

As hereinabove described, the embodiment 3 of the present invention employing a diode element or a bipolar transistor as a clamping element and applying a constant bias voltage to a P-N junction coupled to a signal line can reliably suppress an overshoot voltage and an undershoot voltage.

When the diode element is employed as the clamping element, the element structure can be simplified and the element occupation area can be reduced.

[Embodiment 4]

Figure 13:
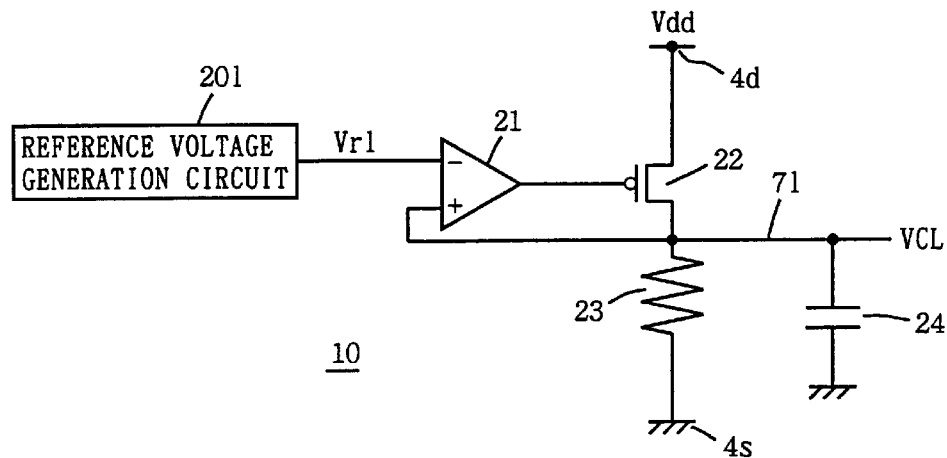
FIG. 13 schematically illustrates the structure of a main part of a semiconductor device according to an embodiment 4 of the present invention.

FIG. 13 schematically illustrates the structure of a semiconductor device according to an embodiment 4 of the present invention, and specifically shows the structure of a part of a bias voltage generation circuit 10 generating a bias voltage VCL for suppressing an undershoot. Referring to FIG. 13, the bias voltage generation circuit 10 includes a reference voltage generation circuit 201 generating a reference voltage Vr1, a comparator 21 comparing the bias voltage VCL on a bias voltage transmission line 71 with the reference voltage Vr1, a p-channel MOS transistor 22 connected between a power supply node 4d and the bias voltage transmission line 71 and receiving an output signal of the comparator 21 on its gate, a resistive element 23 connected between the bias voltage transmission line 71 and a ground node 4s, and a capacitive element 24 connected between the bias voltage transmission line 71 and the ground node 4s.

In the structure of the bias voltage generation circuit 10 shown in FIG. 13, the output signal of the comparator 21 goes high and the p-channel MOS transistor 22 enters an OFF state when the bias voltage VCL is higher than the reference voltage Vr1. In this state, the bias voltage VCL on the bias voltage transmission line 71 is discharged through the resistive element 23. The resistive element 23 merely has a pull-down function. When the bias voltage VCL is lower than the reference voltage Vr1, the level of the output signal from the comparator 21 lowers depending on the difference between the voltages VCL and Vr1, the conductance of the p-channel MOS transistor 22 increases to cause a larger a current flow from power supply node 4d to the bias voltage transmission line 71, and the level of the bias voltage VCL rises.

Therefore, the bias voltage VCL is maintained substantially at the level of the reference voltage Vr1. The bias voltage VCL on the bias voltage transmission line 71 is stably held by charges of the capacitive element 24. Even a base current flows when a corresponding clamping element starts a clamping operation, the capacitive element 24 suppresses instantaneous reduction of the level of the bias voltage VCL, and the bias voltage VCL is stably held at a constant level with a feedback loop of the comparator 21 and the MOS transistor 22, implementing a correct clamping operation.

The resistive element 23 has a resistance value of about several 100 KΩ for implementing low current consumption.

Figure 14:
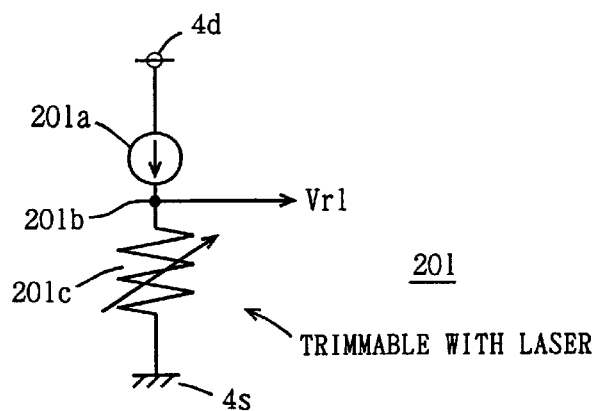
FIG. 14 schematically illustrates the structure of a reference voltage generation circuit shown in FIG. 13.

FIG. 14 illustrates an exemplary structure of the reference voltage generation circuit 201 shown in FIG. 13. Referring to FIG. 14, the reference voltage generation circuit 201 includes a constant current source 201a supplying a constant current from the power supply node 4d and a trimmable resistive element 201c converting the current from the constant current source 201a to a voltage to generate the reference voltage Vr1. Reference voltage Vr1 is generated at a connection node 201b between the constant current source 201a and the resistive element 201c. The resistive element 201c is trimmable by blowing off a fuse element with a laser beam, for example, and a small voltage of several 10 mV can be adjusted by trimming the resistance value thereof.

Assuming that I represents the current supplied by the constant current source 201a and R represents the resistance value of the trimmable resistive element 201c, the reference voltage Vr1 is expressed as I·R. Therefore, the reference voltage Vr1 can be correctly generated at a desired voltage level with low current consumption by sufficiently reducing the constant current I and increasing the resistance value R of the resistive element 201c in view of low current consumption. Since the reference voltage Vr1 is equal to the bias voltage VCL, a voltage of 0.7 V can be readily generated as the reference voltage Vr1.

The constant current source 201a can be formed by a well-known constant current generation circuit.

As hereinabove described, the embodiment 4 of the present invention generating a bias voltage corresponding to a reference voltage by a feedback loop of a comparator and a current drive transistor can accurately and stably generate a bias voltage of a desired level.

[Embodiment 5]

Figure 15:
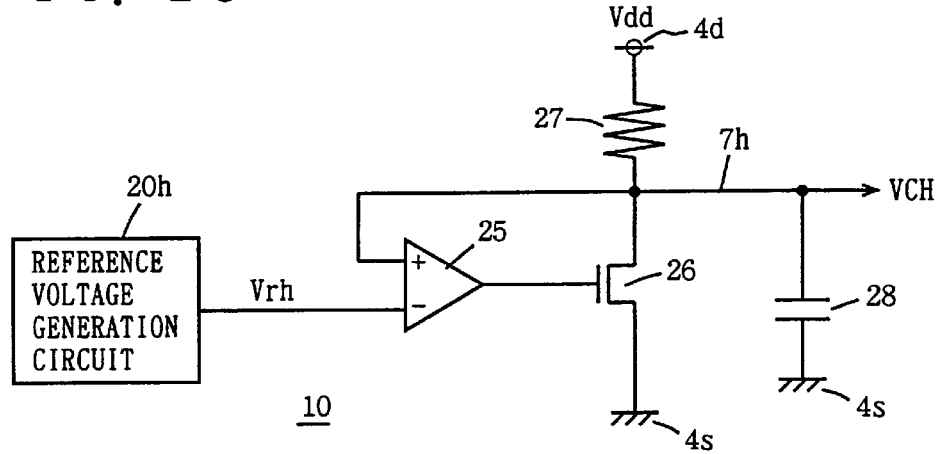
FIG. 15 schematically illustrates the structure of a main part of a semiconductor device according to an embodiment 5 of the present invention.

FIG. 15 schematically illustrates the structure of a semiconductor device according to an embodiment 5 of the present invention, and specifically shows a circuit part for generating a bias voltage for suppressing an overshoot voltage.

Referring to FIG. 15, a bias voltage generation circuit 10 includes a reference voltage generation circuit 20h generating a reference voltage Vrh, a comparator 25 comparing a bias voltage VCH on a bias voltage transmission line 7h with the reference voltage Vrh, an n-channel MOS transistor 26 discharging a current from the bias voltage transmission line 7h to a ground node 4s in accordance with an output signal of the comparator 25, a resistive element 27 connected between a power supply node 4d and the bias voltage transmission line 7h, and a stabilizing capacitive element 28 connected between the bias voltage transmission line 7h and the ground node 4s.

When the bias voltage VCH is higher than the reference voltage Vrh in the structure shown in FIG. 15, the output signal of the comparator 25 goes high proportionately to the difference between the voltages VCH and Vrh and n-channel MOS transistor 26 has the conductance increased to discharge the current from the bias voltage transmission line 7h to the ground node 4s for reducing the level of the bias voltage VCH. When the bias voltage VCH is lower than the reference voltage Vrh, the output signal of the comparator 25 goes low and the n-channel MOS transistor 26 enters an OFF state. In this state, the resistive element 27 supplies a current from the power supply node 4d and the level of the bias voltage VCH rises.

The stabilizing capacitive element 28 prevents a current from flowing into a base region from a signal line to instantaneously increase the level of the bias voltage VCH when a corresponding clamping element starts a clamping operation. The base current can be sufficiently stably supplied (absorbed) also during an operation of a current-driven bipolar transistor by considerably increasing the current supplying capability of the MOS transistor 26. This also applies to the bias voltage generation circuit 10 for suppressing an undershoot shown in FIG. 13.

The resistive element 27 is made to have a resistance value of several 100 KΩ, for example, for reducing current consumption.

When the clamping element shown in FIG. 11A is employed, a current flows into the bias voltage transmission line 7h transmitting the bias voltage VCH in a clamping operation. In this case, however, the current is discharged to the ground node 4s through the MOS transistor 26. Therefore, an overshoot voltage of a relatively large current can also be absorbed. This also applies to the bias voltage generation circuit 10 shown in FIG. 13, and the MOS transistor 22 can sufficiently stably supply the current in FIG. 13.

FIG. 16 illustrates an exemplary structure of the reference voltage generation circuit 20h shown in FIG. 15. Referring to FIG. 16, the reference voltage generation circuit 20h includes a trimmable resistive element 20ha connected between the power supply node 4d and a node 20hb and a constant current source 20hc connected between the node 20hb and the ground node 4s. The reference voltage Vrh is generated at node 20hb. In the reference voltage generation circuit 20h shown in FIG. 16, the reference voltage Vrh is expressed as follows:

$$Vrh = Vdd - I \cdot R$$

The resistive element 20ha is a trimmable resistive element having a resistance value adjustable by blowing a fuse element, for example. Therefore, an optimum bias voltage Vrh (=Vdd−0.4 V or Vdd−0.7 V) can be readily produced in combination with the current of the constant current source 20hc by setting the resistive element 20ha at an appropriate resistance value. Further, the bias voltage Vrh can be produced correctly at a desired level by adjusting the resistance value of the resistive element 20ha by trimming.

The constant current source 20hc can be formed by a well-known constant current generation circuit.

As hereinabove described, in the embodiment 5 of the present invention a bias voltage VCH can be generated correctly at a desired level by a feedback loop of a comparator and a MOS transistor. Even if the level of the bias voltage VCH rises (charges of an overshoot voltage flow into a bias voltage transmission line) when a clamping operation starts, a MOS transistor can reliably discharge the current, and the clamping operation can be correctly and reliably performed also when a current-driven element is employed as a clamping element.

[Embodiment 6]

FIG. 17 illustrates the structure of a semiconductor device according to an embodiment 6 of the present invention, and specifically shows a circuit structure for generating a bias voltage VCL for suppressing an undershoot voltage.

Referring to FIG. 17, a bias voltage generation circuit 10 includes a reference voltage generation circuit 201 generating a reference voltage Vr1a, a level shift element 30 for shifting down the level of a bias voltage VCL on a bias voltage transmission line 71, a comparator 21 comparing a bias voltage VCLs level-shifted by the level shift element 30 with the reference voltage Vr1a, a p-channel MOS transistor 22 supplying a current from a power supply node 4d to the bias voltage transmission line 71 in accordance with an output signal of the comparator 21, a resistive element 23 of high resistance connected between the level shift element 30 and a power source node 4b, and a capacitive element 24 for stabilizing the bias voltage VCL on the bias voltage transmission line 71.

The power source node 4b is supplied with a negative voltage VBB. Even when a power supply voltage Vdd is at a low voltage level and the bias voltage VCL has a low voltage level proportionately, the level-shifted voltage VCLs from the level shift element 30 can be stably generated by employing the negative voltage VBB. The negative voltage VBB may be produced by a bias voltage applied to a substrate region of a memory cell if an internal circuit is a dynamic random access memory. Alternatively, the negative voltage VBB may be generated from a dedicately provided negative voltage generation circuit.

The level shift element 30 is identical in structure to the clamping element 5. Therefore, a P-N diode 30a shown in FIG. 18A, a diode-connected npn bipolar transistor 30b shown in FIG. 18B or a diode-connected pnp bipolar transistor 30c shown in FIG. 18C can be employed for the level shift element 30. When the bias voltage generation circuit 10 shown in FIG. 17 is employed with the clamping element 5 formed of the npn bipolar transistor 5a shown in FIG. 3A, the diode-connected npn bipolar transistor 30b shown in FIG. 18B is preferably employed in order to equalize the temperature dependency of a voltage drop in the level shift element 30 with that of the P-N junction built-in voltage of the clamping element 5. The bias voltage generation circuit 10 shown in FIG. 17 has a function of canceling the temperature dependency of the P-N junction built-in voltage of the clamping element 5. A diode element having the same structure as a clamping element is hereinafter referred to as a level shift element.

The bias voltage generation circuit 10 shown in FIG. 17 adjusts the level of the bias voltage VCL such that the level-shifted voltage VCLs from the level shift element 30 is equal to the reference voltage Vr1a. The resistive element 23 is of high resistance and the level shift element 30 operates in a diode mode. Therefore, the bias voltage VCL is expressed as follows:

$$VCL = Vr1a + Vf$$

where Vf represents the level-shifted voltage in the level shift element 30, i.e., a forward voltage drop in a diode element or a base-to-emitter built-in voltage in a diode-connected bipolar transistor.

The clamping element 5 shown in FIG. 3A starts conducting when the signal SIG reaches a voltage level at the base-to-emitter voltage of npn bipolar transistor 5a minus the base-to-emitter built-in voltage Vf. A voltage $V_0$ at which npn bipolar transistor 5a starts conducting is expressed as follows:

$$V_0 = VBE - Vf = VCL - Vsig - Vf$$

where Vsig represents the voltage of the signal SIG on the signal line 2, and VBE represents the base-to-emitter voltage of the npn bipolar transistor 5a.

When the voltage from the bias voltage generation circuit 10 shown in FIG. 17 is applied as the bias voltage VCL, the voltage $V_0$ is expressed as follows:

$$Vo = VBE - Vf = Vr1a + Vf - Vsig - Vf$$
$$= Vr1a - Vsig$$

When the voltage $V_0$ is equal to 0 V, a clamping bipolar transistor or a diode element (see FIG. 11A) can be conductive. In other words, the clamping level for an undershoot voltage can be determined by the reference voltage Vr1a. The bias voltage VCL is equal to the voltage Vf (=0.7 V) when the reference voltage Vr1a from the reference voltage generation circuit 201 is set at a ground voltage Vss, while the bias voltage VCL can be set at 0.4 V, for example, when the reference voltage Vr1a is at a negative level. The reference voltage generation circuit 201 may utilize the negative voltage VBB in order to generate the reference voltage Vr1a, and the comparator 21 may be coupled to the negative power supply node 4b in place of a ground node.

Figure 19A:
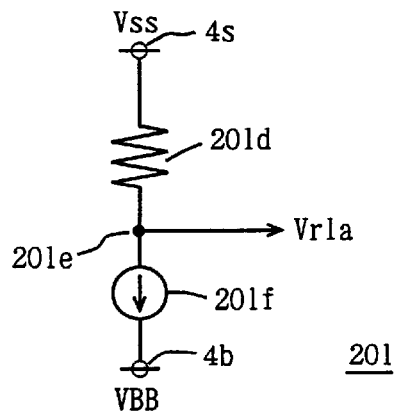
FIG. 19A illustrates the structure of a reference voltage generation circuit shown in FIG. 17.

FIG. 19A illustrates an exemplary structure of the reference voltage generation circuit 201 shown in FIG. 17. Referring to FIG. 19A, the reference voltage generation circuit 201 includes a resistive element 201d connected between a ground node 4s and a node 201e, and a constant current source 201f connected between the node 201e and the negative power source node 4b. In the structure of the reference voltage generation circuit 201 shown in FIG. 19A, the reference voltage Vr1a is expressed as follows:

$$Vr1a = -I \cdot R$$

where I and R represent the current supplied by the constant current source 201f and the resistance value of the resistive element 201d respectively. When the resistive element 201d is connected to the power supply node 4d in place of the ground node 4s in the structure shown in FIG. 19A, the reference voltage Vr1a is expressed as Vdd−I·R. In this case, the reference voltage Vr1a can be generated at a negative level or the ground voltage level.

Figure 19B:
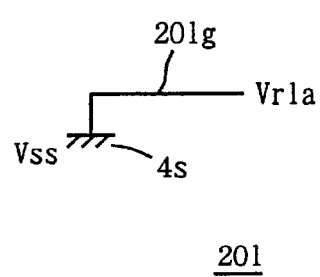
FIG. 19B illustrates the structure of a modification of the reference voltage generation circuit shown in FIG. 17.

FIG. 19B illustrates another exemplary structure of the reference voltage generation circuit 201 shown in FIG. 17. Referring to FIG. 19B, the reference voltage Vr1a is generated from a line 201g coupled to the ground node 4s. Therefore, the reference voltage Vr1a is equal to the ground voltage Vss. In this case, the bias voltage VCL is equal to the built-in voltage Vf. Either structure is employable.

When the reference voltage generation circuit 201 shown in FIG. 19A or 19B is employed, the reference voltage Vr1a is 0 V or at a negative level, and the comparator 21 operates using the negative voltage VBB of the negative power source node 4b.

As hereinabove described, the embodiment 6 of the present invention employs a level shift element having the same structure as a clamping element for shifting the level of a bias voltage for comparison with a reference voltage, whereby the temperature dependency of a built-in voltage of the clamping element can be canceled for stably clamping an undershoot voltage at a constant damping level over a wide temperature region.

[Embodiment 7]

Figure 20:
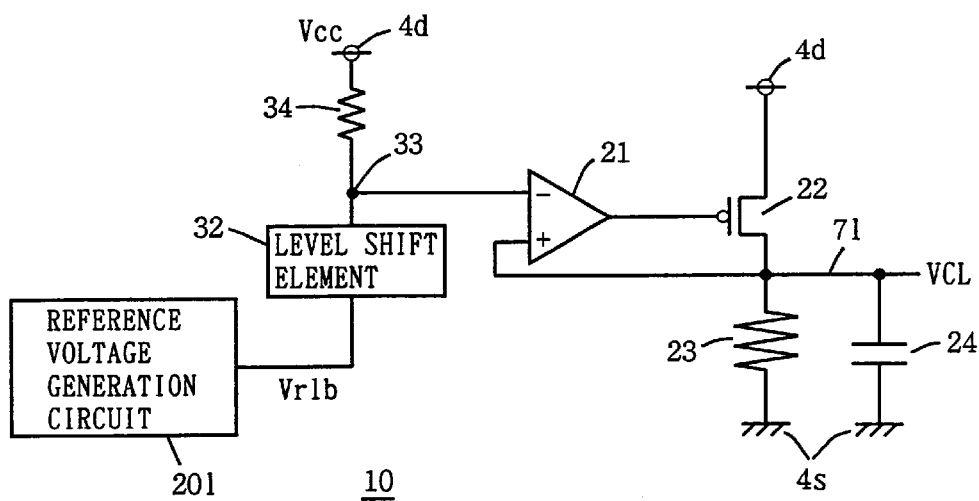
FIG. 20 schematically illustrates the structure of a main part of a semiconductor device according to an embodiment 7 of the present invention.

FIG. 20 illustrates the structure of a semiconductor device according to an embodiment 7 of the present invention and specifically shows the structure of a bias voltage generation circuit 10 generating a bias voltage VCL for suppressing an undershoot voltage. Referring to FIG. 20, the bias voltage generation circuit 10 includes a reference voltage generation circuit 201 generating a reference voltage Vr1b, a level shift element 32 connected between an output node of the reference voltage generation circuit 201 and a node 33, and a resistive element 34 of high resistance connected between a power supply node 4d and the node 33. The level shift element 32 is identical in structure to a clamping element for clamping an undershoot voltage, and formed of the diode element 30a shown in FIG. 18A or the diode-connected npn bipolar transistor 30b shown in FIG. 18B, for example.

The bias voltage generation circuit 10 further includes a comparator 21 comparing the voltage on the node 33 with a bias voltage VCL on a bias voltage transmission line 71, a p-channel MOS transistor 22 supplying a current from the power supply node 4d to the bias voltage transmission line 71 in accordance with an output signal of the comparator 21, and a resistive element 23 and a capacitive element 24 each connected between the bias voltage transmission line 71 and a ground node 4s for stabilizing the bias voltage VCL. The resistive element 23 prevents the level of the bias voltage VCL from increasing beyond a prescribed voltage level.

In the structure of the bias voltage generation circuit 10 shown in FIG. 20, the comparator 21 adjusts the conductance of the p-channel MOS transistor 22 such that the voltage on the node 33 is equal to the bias voltage VCL. The voltage of the node 33 is expressed as Vr1b+Vf, and the bias voltage VCL is expressed as follows:

$$VCL = Vr1b + Vf$$

Also in the structure shown in FIG. 20, the bias voltage VCL includes a P-N junction built-in voltage Vf, and hence the built-in voltage in the clamping transistor can be canceled and the clamping voltage for the undershoot voltage can be set at the level of the reference voltage Vr1b. Thus, a clamping voltage level can be set with no temperature dependency.

Figure 21:
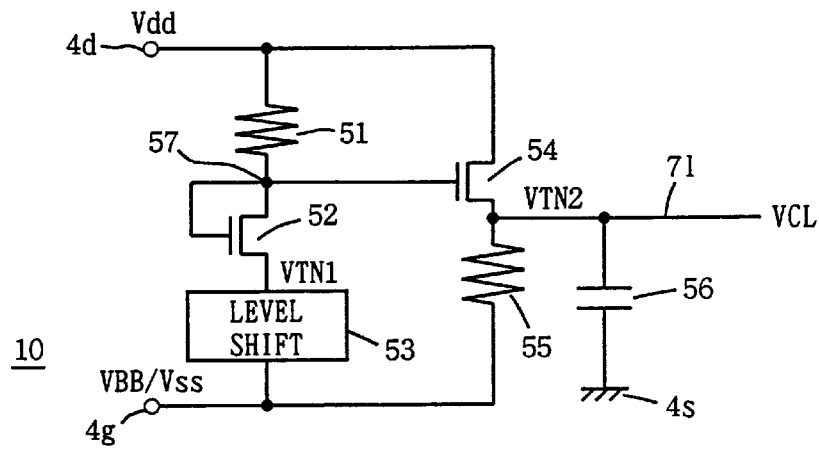
FIG. 21 schematically illustrates the structure of a main part of a semiconductor device according to an embodiment 8 of the present invention.

The structure shown in FIG. 19A or 19B can be employed for the reference voltage generation circuit 201 shown in FIG. 21.

As hereinabove described, the embodiment 7 of the present invention shifts up the level of a reference voltage from a reference voltage generation circuit for comparison with a bias voltage to adjust the level of the bias voltage in accordance with the result of the comparison, whereby the bias voltage includes the P-N junction built-in voltage of a level shift element so that influence by the built-in voltage of a transistor for clamping an undershoot voltage can be canceled and the clamping level for the undershoot voltage can be set with no temperature dependency.

[Embodiment 8]

FIG. 21 illustrates the structure of a semiconductor device according to an embodiment 8 of the present invention, and specifically shows a circuit part for generating a bias voltage VCL for suppressing an undershoot voltage.

Referring to FIG. 21, a bias voltage generation circuit 10 includes a resistive element 51 of high resistance connected between a power supply node 4d and a node 57, and a diode-connected n-channel MOS transistor 52 and a level shift element 53 serially connected between the node 57 and a power supply node 4g. The power source node 4g is supplied with a negative voltage VBB or a ground voltage Vss. The level of the voltage supplied to the power source node 4g is determined depending on the level of the bias voltage VCL. The diode-connected n-channel MOS transistor 52 has a threshold voltage VTN1. The level shift element 53 has any of the structures shown in FIGS. 18A to 18C.

The bias voltage generation circuit 10 further includes an n-channel MOS transistor 54 connected between the power supply node 4d and a bias voltage transmission line 71 with its gate connected to the node 57, a resistive element 55 connected between the bias voltage transmission line 71 and the power source node 4g, and a stabilizing capacitive element 56 for stabilizing the bias voltage VCL on the bias voltage transmission line 71. The n-channel MOS transistor 54 has a threshold voltage VTN2. The threshold voltage VTN2 of the MOS transistor 54 is set higher than the threshold voltage VTN1 of the MOS transistor 52 (VTN2>VTN1). Operations are now described.

The resistive element 51 has a resistance value sufficiently larger than ON resistance of the n-channel MOS transistor 52, which in turn operates in a diode mode for causing a voltage drop of the threshold voltage VTN1. The voltage V(57) of the node 57 is expressed as follows:

$$V(57) = V(4g) + Vf + VTN1$$

where V(4g) represents the voltage (the negative voltage VBB or the ground voltage Vss) supplied to the power source node 4g, and Vf represents a built-in voltage in the level shift element 53.

The MOS transistor 54 having the gate voltage V(57) lower than a drain voltage (Vdd) operates in a source-follower mode. In other words, the n-channel MOS transistor 54 enters an OFF state when the difference between the voltage V(57) of the node 57 and the bias voltage VCL is smaller than the threshold voltage VTN2, and is rendered conductive when the difference between the voltage V(57) of the node 57 and the bias voltage VCL is larger than the threshold voltage VTN2 for supplying a current to the bias voltage transmission line 71. Therefore, the bias voltage VCL is maintained at a level expressed as follows:

$$VCL = V(57) - VTN2$$
$$= Vf + (VTN1 - VTN2) + V(4g)$$

The second term of the above expression shows the difference between the threshold voltages VTN1 and VTN2 of the n-channel MOS transistors 52 and 54. Influence by variation of operating temperature and fabrication conditions is canceled, and the bias voltage VCL is at a level substantially independent of the variation of the operating temperature and fabrication conditions. The voltage V(4g) is at the level of the negative voltage VBB or the ground voltage Vss, which is not dependent on the temperature. The bias voltage VCL includes the P-N junction built-in voltage of the level shift element 53, and hence contribution of the P-N junction built-in voltage of a clamping element for suppressing the undershoot voltage to the clamping level for the undershoot voltage can be canceled. The clamping level for the undershoot voltage is expressed as follows:

$$(VTN1 - VTN2) + V(4g)$$

Therefore, the clamping voltage is at a constant level not dependent on the variation of the temperature and fabrication conditions. Since the threshold voltage VTN2 is greater than the threshold voltage VNT1, the clamping voltage is at a negative level. In this case, the voltage V(4g) may be at the level of the ground voltage Vss. The resistive element 55 prevents the bias voltage VCL from increasing beyond a prescribed level.

When a base current of a clamping transistor flows and the bias voltage VCL lowers upon starting of a clamping operation in the structure of the bias voltage generation circuit 10 shown in FIG. 21, the MOS transistor 54 can supply a current with sufficient margin (the channel width of the MOS transistor 54 is sufficiently large). In this case, the MOS transistor 52 may simply hold the gate capacitance of the MOS transistor 54 at a prescribed voltage level, and is not required of large current drivability. Thus, current consumption of the bias voltage generation circuit 10 can be sufficiently reduced.

The relation between the threshold voltages VTN1 and VTN2 of the MOS transistors 52 and 54 may be appropriately determined depending on the voltage VBB/Vss supplied to the power source node 4g. If the threshold voltages VTN1 and VTN2 are equal to each other, for example, the bias voltage VCL is equal to the P-N junction built-in voltage Vf of the level shift element 53 and the clamping voltage for the undershoot voltage can be set at the level of the ground voltage Vss by applying the ground voltage Vss to the power source node 4g. If the threshold voltage VTN1 is higher than the threshold voltage VTN2, the bias voltage VCL can be set at a level lower than the P-N junction built-in voltage Vf of the level shift element 53 by applying the negative voltage VBB to the power source node 4g. The values of the threshold voltages VTN1 and VTN2 and the voltage applied to the power source node 4g may be appropriately determined depending on the clamping level for the undershoot voltage.

In general, an internal circuit of a semiconductor device includes a plurality of MOS transistors having threshold voltages. When an internal functional circuit is a dynamic random access memory circuit, for example, the threshold voltage of a MOS transistor of a peripheral circuit is made smaller than that of a memory cell transistor (access transistor). This is because a boosted voltage is applied to the gate of the memory cell transistor and a gate insulation film thereof must be greater in thickness than the MOS transistor of the peripheral circuit. Therefore, the threshold voltages VTN1 and VTN2 of the MOS transistors 52 and 54 can be made different from each other without increasing the number of fabrication steps.

As hereinabove described, in the embodiment 8 of the present invention, a level shift element having the same structure as a clamping element and a diode-connected MOS transistor are employed for producing a first reference voltage and the first reference voltage is transmitted through a source-follower transistor for generating a bias voltage. Thus, influence by temperature dependency of a P-N junction built-in voltage of a clamping transistor can be canceled by the bias voltage and influence by variation of the temperature and fabrication parameters on the threshold voltage of a MOS transistor can be canceled for stably clamping an undershoot voltage at a constant level over a wide operating temperature range.

[Embodiment 9]

Figure 22:
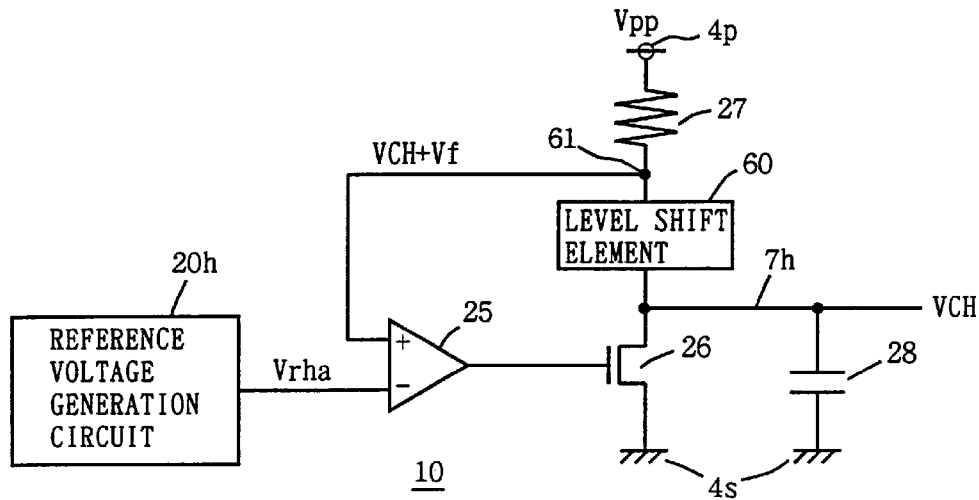
FIG. 22 schematically illustrates the structure of a main part of a semiconductor device according to an embodiment 9 of the present invention.

FIG. 22 schematically illustrates the structure of a semiconductor device according to an embodiment 9 of the present invention and specifically shows a circuit part for generating a bias voltage VCH for suppressing an overshoot voltage.

Referring to FIG. 22, a bias voltage generation circuit 10 includes a resistive element 27 connected between a high-voltage node 4p receiving a high voltage Vpp and a node 61, a level shift element 60 connected between the node 61 and a bias voltage transmission line 7h, a comparator 25 comparing the voltage of the node 61 with a reference voltage Vrha from a reference voltage generation circuit 20h and an n-channel MOS transistor 26 discharging a current from the bias voltage transmission line 7h to a ground node 4s in accordance with an output signal of the comparator 25. The bias voltage transmission line 7h is provided with a stabilizing capacitive element 28 for suppressing instantaneous reduction of the bias voltage VCH caused by a base current generated in a clamping operation or a current through a diode.

The level shift element 60 is identical in structure to a clamping element for suppressing an overshoot voltage (see FIGS. 18A to 18C). The resistive element 27 has a resistance value greater than the ON resistance of the level shift element 60.

In the structure of the bias voltage generation circuit 10 shown in FIG. 22, the comparator 25 adjusts the level of the bias voltage VCH such that the reference voltage Vrha is equal to a voltage VCH+Vf on the node 61, where Vf represents a voltage drop (P-N junction built-in voltage) across the level shift element 60. Therefore, the bias voltage VCH is expressed as follows:

$$VCH = Vrha - Vf$$

The pnp bipolar transistor 5b for clamping an overshoot voltage shown in FIG. 9A starts conducting when the voltage level of the signal SIG on the signal line 2 satisfies the following relation:

$$Vsig = VCH + Vf$$

When the signal SIG reaches the voltage Vsig, the pnp clamping bipolar transistor 5b starts conducting. From the above expressions, the following relation is obtained:

$$Vsig = VCH + Vf = Vrha$$

In other words, the pnp bipolar transistor 5b for clamping the overshoot voltage starts conducting when the signal SIG reaches the level of the reference voltage Vrha, for clamping the signal SIG at this voltage level. The clamping level for the overshoot voltage is determined merely by the reference voltage Vrha with no influence of the P-N junction built-in voltage of the clamping bipolar transistor 5b. Thus, the clamping voltage can be set at a constant level with no influence by the temperature (temperature dependency of the collector-to-emitter saturation voltage of the clamping transistor 5b is neglected). Thus, a leakage current of the clamping pnp bipolar transistor 5b under a high temperature can be suppressed.

The high-voltage node 4p supplying the high voltage Vpp is employed for reliably generating the voltage VCH+Vf at the node 61.

Figure 23A:
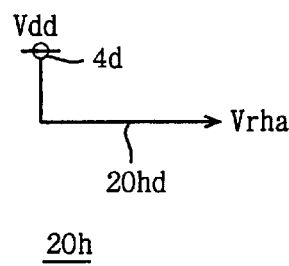
FIG. 23A illustrates the structure of a reference voltage generation circuit shown in FIG. 22.

FIG. 23A illustrates an exemplary structure of the reference voltage generation circuit 20h shown in FIG. 22. Referring to FIG. 23A, the reference voltage generation circuit 21h includes a line 20hd connected to a power supply node 4d. The line 20hd outputs the reference voltage Vrha. In the structure of the reference voltage generation circuit 20h shown in FIG. 23A, the reference voltage Vrha is equal to a power supply voltage Vdd. Therefore, the voltage for clamping the overshoot voltage is at the level of the power supply voltage Vdd.

Figure 23B:
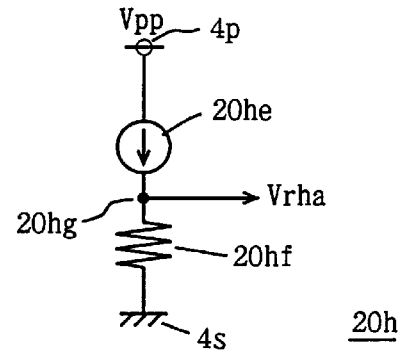
FIG. 23B illustrates the structure of a modification of the reference voltage generation circuit shown in FIG. 22.

FIG. 23B illustrates another exemplary structure of the reference voltage generation circuit 20h shown in FIG. 22. Referring to FIG. 23B, the reference voltage generation circuit 20h includes a constant current source 20he connected between the high-voltage node 4p and a node 20hg, and a resistive element 20hf connected between the node 20hg and a ground node 4s. The node 20hg outputs the reference voltage Vrha. In the structure of the reference voltage generation circuit 20h shown in FIG. 23B, the reference voltage Vrha is equal to a voltage level I·R. The reference voltage Vrha can be set at a desired level through the resistance value R of the resistive element 20hf and a current I supplied by the constant current source 20he. The reference voltage Vrha can be generated at a level higher than the power supply voltage Vdd by utilizing the high voltage Vpp of the high-voltage node 4p. The level of the reference voltage Vrha can be correctly set by rendering the resistive element 20hf trimmable.

[Modification]

Figure 24:
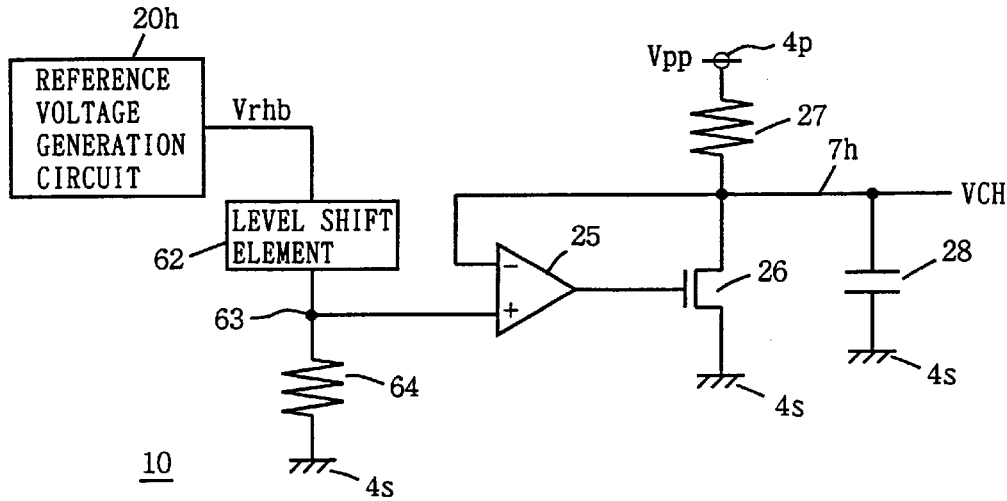
FIG. 24 schematically illustrates the structure of a modification of the embodiment 9 of the present invention.

FIG. 24 illustrates the structure of a modification of the embodiment 9 of the present invention. Referring to FIG. 24, a bias voltage generation circuit 10 includes a reference voltage generation circuit 20h generating a reference voltage Vrhb, a level shift element 62 provided between an output node of the reference voltage generation circuit 20h and a node 63, and a resistive element 64 connected between the node 63 and a ground node 4s. The resistive element 64 has a resistance value higher than the ON resistance of the level shift element 62.

The bias voltage generation circuit 10 further includes a resistive element 27 connected between a high-voltage node 4p and a bias voltage transmission line 7h, a comparator 25 comparing a bias voltage VCH with the voltage of the node 63, an n-channel MOS transistor 26 discharging a current from the bias voltage transmission line 7h to the ground node 4s in accordance with an output signal of the comparator 25, and a stabilizing capacitive element 28 for stabilizing the bias voltage VCH.

In the structure of the bias voltage generation circuit 10 shown in FIG. 24, the resistance value of the resistive element 64 is sufficiently higher than the ON resistance of the level shift element 62, whereby a voltage drop of the voltage Vf is caused in across level shift element 62 having the same structure as a clamping element, and the voltage V(63) of the node 63 is expressed as follows:

$$V(63) = Vrhb - Vf$$

The comparator 25 and the MOS transistor 26 hold the bias voltage VCH at the voltage level of the node 63. Therefore, the bias voltage VCH is expressed as follows:

$$VCH = Vrhb - Vf$$

The resistive element 27 is provided simply for preventing excess reduction of the bias voltage VCH. The bias voltage generation circuit 10 shown in FIG. 24 generates the bias voltage VCH substantially at the same level as that generated by the bias voltage generation circuit 10 shown in FIG. 22. Similarly to the bias voltage generation circuit 10 shown in FIG. 22, the level for clamping the overshoot voltage is equal to the reference voltage Vrhb. Also in this case, effect of the P-N junction built-in voltage on the clamping level for the overshoot voltage can be canceled and the overshoot voltage can be stably clamped at a constant level over a wide temperature range.

The structure of the reference voltage generation circuit 20h shown in FIG. 23A or 23B can be employed for the reference voltage generation circuit 20h shown in FIG. 24.

As hereinabove described, the embodiment 9 of the present invention determines a clamping bias voltage using a level shift element having the same structure as an element for clamping an overshoot voltage, whereby effect of the P-N junction built-in voltage of the level shift element is canceled and a bias voltage generation circuit capable of stably clamping an overshoot voltage at a constant voltage level over a wide temperature range can be obtained.

While charges of the overshoot voltage may flow to instantaneously increase the level of the bias voltage VCH in operation of the clamping element in the structure shown in FIGS. 22 and 23A or 23B, the stabilizing capacitive element 28 can absorb the charges in this case and the driving n-channel MOS transistor 26 can reliably discharge the flowing charges, for holding the bias voltage VCH at a constant level.

[Embodiment 10]

Figure 25:
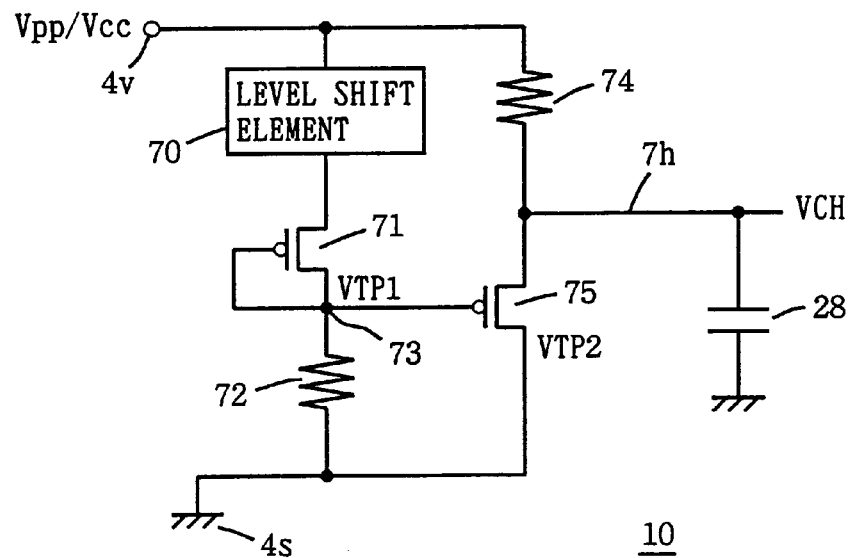
FIG. 25 schematically illustrates the structure of a main part of a semiconductor device according to an embodiment 10 of the present invention.

FIG. 25 illustrates the structure of a semiconductor device according to an embodiment 10 of the present invention and specifically shows a circuit part generating a bias voltage VCH for clamping an overshoot voltage.

Referring to FIG. 25, a bias voltage generation circuit 10 includes a level shift element 70 and a p-channel MOS transistor 71 serially connected between a power supply node 4v and a node 73, a resistive element 72 of high resistance connected between the node 73 and a ground node 4s, a resistive element 74 connected between the power supply node 4v and a bias voltage transmission line 7h, a p-channel MOS transistor 75 connected between the bias voltage transmission line 7h and the ground node 4s with its node connected to the node 73, and a capacitive element 28 for stabilizing the bias voltage VCH.

The level shift element 70 is identical in structure to a clamping element (see FIGS. 18A to 18C) for clamping the overshoot voltage, and causes a voltage drop of voltage Vf. The p-channel MOS transistor 71 has a gate and a drain interconnected with each other, and operates in a diode mode. The MOS transistor 71 has ON resistance set sufficiently smaller than that of the resistive element 72 and causes a voltage, drop of the absolute value of its threshold voltage VTP1. The p-channel MOS transistor 75 has a threshold voltage VTP2. The absolute value of the threshold voltage VTP1 of the MOS transistor 71 is made smaller than that of the threshold voltage VTP2 of the MOS transistor 75. Operations are now described.

With voltage drops in the level shift element 70 and the p-channel MOS transistor 71, the voltage V(73) of the node 73 is expressed as follows:

$$V(73) = V(4v) - Vf - |VTP1|$$

where V(4v) represents a voltage supplied to the power supply node 4v, which is at the level of a high voltage Vpp or a power supply voltage Vdd. The p-channel MOS transistor 75 is rendered conductive when its source-to-gate voltage exceeds the absolute value of the threshold voltage VTP2, for clamping the bias voltage VCH on its source, i.e., on the bias voltage transmission line 7h at the following level:

$$VCH = V(73) + |VTP2|$$
$$= V(4v) - Vf - |VTP1| + |VTP2|$$

The difference between the absolute values of the threshold voltages VTP1 and VTP2 is taken in the above bias voltage VCH, for canceling influence by variation of temperature conditions and fabrication parameters on the threshold voltages VTP1 and VTP2 of the MOS transistors 71 and 75. When this bias voltage VCH is employed, the clamping voltage level for the overshoot voltage is expressed as follows:

$$V(4v) + |VTP2| - |VTP1|$$

Since the absolute value of the threshold voltage VTP2 is greater than that of the threshold voltage VTP1, the clamping voltage level for the overshoot voltage exceeds the power supply voltage Vdd. In this case, therefore, a leakage current can be suppressed when a signal SIG on a signal line is at the level of the power supply voltage Vdd. When the high voltage Vpp is employed, the clamping voltage for the signal SIG is at the level of the voltage Vpp. When the high voltage Vpp is employed, therefore, the absolute value of the threshold voltage VTP2 may be made smaller than that of the threshold voltage VTP1. Alternatively, the absolute values of the threshold voltages VTP1 and VTP2 may be equalized with each other. These absolute values may be appropriately set depending on the clamping level for the overshoot voltage.

When the absolute value of the threshold voltage VTP2 is greater than that of the threshold voltage VTP1, the power supply voltage Vdd can be employed and no circuit is required for generating the high voltage Vpp. The high voltage Vpp may be generated from an internally provided high voltage generation circuit when the internal circuit is a DRAM (dynamic random access memory).

[Modification]

Figure 26:
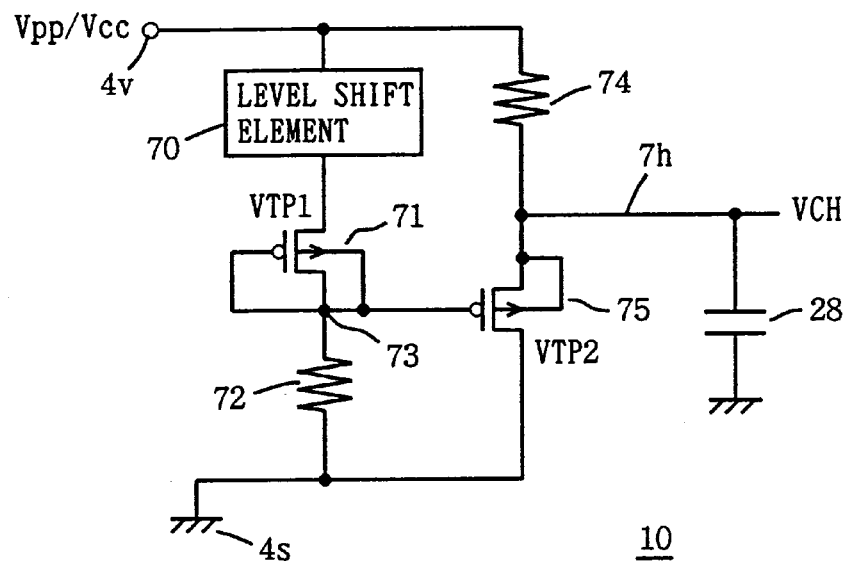
FIG. 26 illustrates the structure of a modification of the embodiment 10 of the present invention.

FIG. 26 illustrates the structure of a modification of the embodiment 10 of the present invention. In a bias voltage generation circuit 10 shown in FIG. 26, a back gate of a p-channel MOS transistor 71 is connected to a node 73, and a back gate of a p-channel MOS transistor 75 is coupled to a bias voltage transmission line 7h. In other words, the back gate of the p-channel MOS transistor 71 is connected to a drain and that of the p-channel MOS transistor 75 is connected to a source. The p-channel MOS transistor 75, has the back gate and the source at the same potential due to the interconnection therebetween, to cause no back gate bias effect.

In the p-channel MOS transistor 71, the back gate is coupled to the drain and difference is caused between the back gate voltage and the source voltage, to result in a back gate bias effect. The back gate potential is lower than the source potential in this case, and the absolute value of the threshold voltage of the p-channel MOS transistor 71 reduces. Even if the p-channel MOS transistors 71 and 75 are formed in the same fabrication process with the same threshold voltage value, the threshold voltage VTP1 of the MOS transistor 71 can be made different from the threshold voltage VTP2 of the p-channel MOS transistor 75 by connecting the back gates thereof with different electrode nodes without increasing the number of fabrication processes (|VTP1|<|VTP2|).

As hereinabove described, the embodiment 10 of the present invention generates the bias voltage VCH using a level shift element of the same structure as a clamping element for clamping an overshoot voltage, a diode-connected p-channel MOS transistor and a source-follower p-channel MOS transistor, whereby temperature dependency of a P-N junction built-in voltage of a clamping transistor is canceled due to the presence of the level shift element and the overshoot voltage can be stably clamped at a constant voltage level over a wide temperature range. Further, the bias voltage is generated by simply shifting the voltage with no requirement for a compare circuit or the like, whereby the circuit structure is simplified.

While the level of the bias voltage VCH rises due to the overshoot voltage when a clamping operation starts in the structure shown in FIG. 25 or 26, charges resulting from the overshoot voltage can be sufficiently absorbed by sufficiently increasing the current drivability of the p-channel MOS transistor 75. Further, the stabilizing capacitive element 28 absorbs instantaneous change of the bias voltage VCH.

[Embodiment 11]

Figure 27:
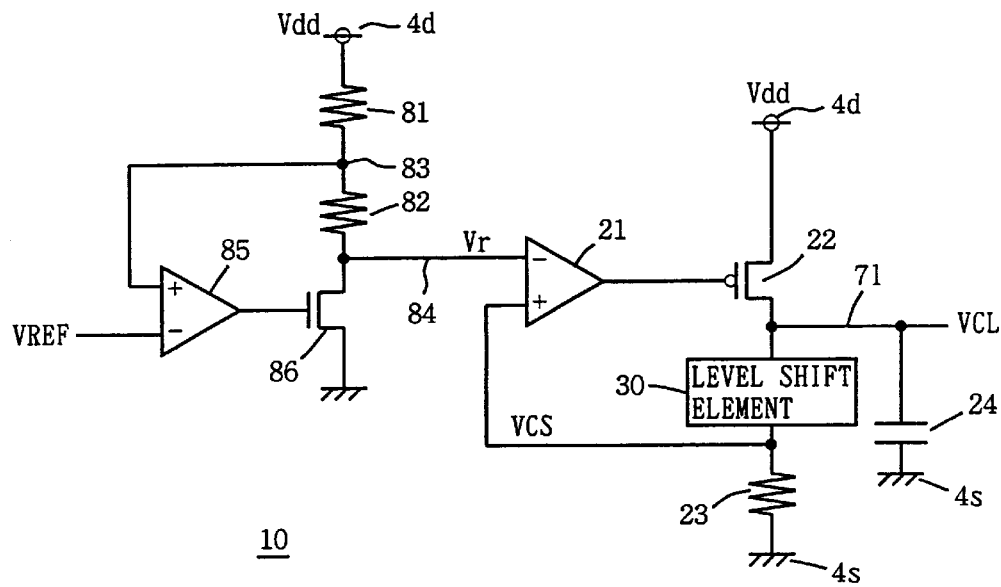
FIG. 27 schematically illustrates the structure of a main part of a semiconductor device according to an embodiment 11 of the present invention.

FIG. 27 schematically illustrates the structure of a semiconductor device according to an embodiment 11 of the present invention, and specifically figure shows the structure of a circuit generating a bias voltage VCL for clamping an undershoot voltage.

Referring to FIG. 27, a bias voltage generation circuit 10 includes resistive elements 81 and 82 serially connected between a power supply node 4d and a reference voltage transmission line 84, a comparator 85 comparing the voltage on a connection node 83 between the resistive elements 81 and 82 with a reference voltage VREF and an n-channel MOS transistor 86 adjusting the level of a reference voltage Vr on the reference voltage transmission line 84 in accordance with an output signal of the comparator 85. The reference voltage VREF for determining the central voltage level of a signal SIG is externally supplied or internally generated.

The bias voltage generation circuit 10 further includes a level shift element 30 for shifting down the level of a voltage on a bias voltage transmission line 71, a comparator 21 comparing a voltage VCS outputted from the level shift element 30 with the reference voltage Vr, a p-channel MOS transistor 22 supplying a current from the power supply node 4d to the bias voltage transmission line 71 in accordance with an output signal of the comparator 21, a resistive element 23 of high resistance connected between the level shift element 30 and a ground node 4s, and a stabilizing capacitive element 24 for stabilizing the bias voltage VCL. The comparator 21, the MOS transistor 22, the level shift element 30, the resistive element 23 and the stabilizing capacitive element 24 are substantially identical in structure to those shown in FIG. 17. Therefore, the resistive element 23 may be coupled to a negative power source node, in place of the ground node 4s. Operations are now described.

The comparator 85 and the n-channel MOS transistor 86 adjust the level of the reference voltage Vr such that the voltage V(83) of the node 83 is equal to the reference voltage VREF. In stabilization, the voltage V(83) of the node 83 is expressed as follows:

$$V(83) = (R81 \cdot Vr + R82 \cdot Vdd)/(R81 + R82)$$

where R81 and R82 represent the resistance values of the resistive elements 81 and 82 respectively. The comparator 21 adjusts the level of the bias voltage VCL such that the bias voltage VCS level-shifted by the level shift element 30 is equal to the reference voltage Vr. Therefore, the a bias voltage VCL is expressed as follows:

$$VCL = Vr + Vf$$

On the other hand, the reference voltage Vr is expressed as follows:

$$Vr = \{(VREF \cdot (R81 + R82) - R82 \cdot Vdd\}/R81$$
$$= VREF - R82(Vdd - VREF)/R81$$
$$= VREF - \Delta$$

Hence, the bias voltage VCL is expressed as follows:

$$VCL = VREF + Vf \cdot \Delta$$

When the npn bipolar transistor 5a shown in FIG. 3A or 5A or the diode element 5db shown in FIG. 11A is employed as a clamping element, the level of a clamping voltage for an undershoot voltage of the signal SIG is VREF-Δ.

Figure 28:
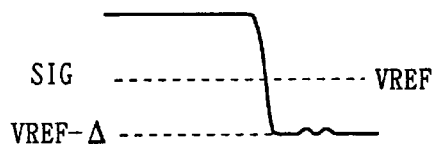
FIG. 28 is a signal waveform diagram respecting a clamping operation of the semiconductor device shown in FIG. 27.

When high and low levels of the signal SIG are determined with reference to the reference voltage VREF as shown in FIG. 28, therefore, the lower limit voltage can be clamped at VREF-Δ. As to an interface for such a signal SIG, upper and lower amplitudes of 0.2 V with reference to the reference voltage VREF are standardized in an SSTL, for example. Such a signal has a small amplitude and is transmitted at a high speed, to readily cause an overshoot and an undershoot. The signal having a small amplitude can be correctly transmitted by clamping the undershoot voltage level at the lower limit using the bias voltage generation circuit 10 shown in FIG. 27.

[Modification]

Figure 29:
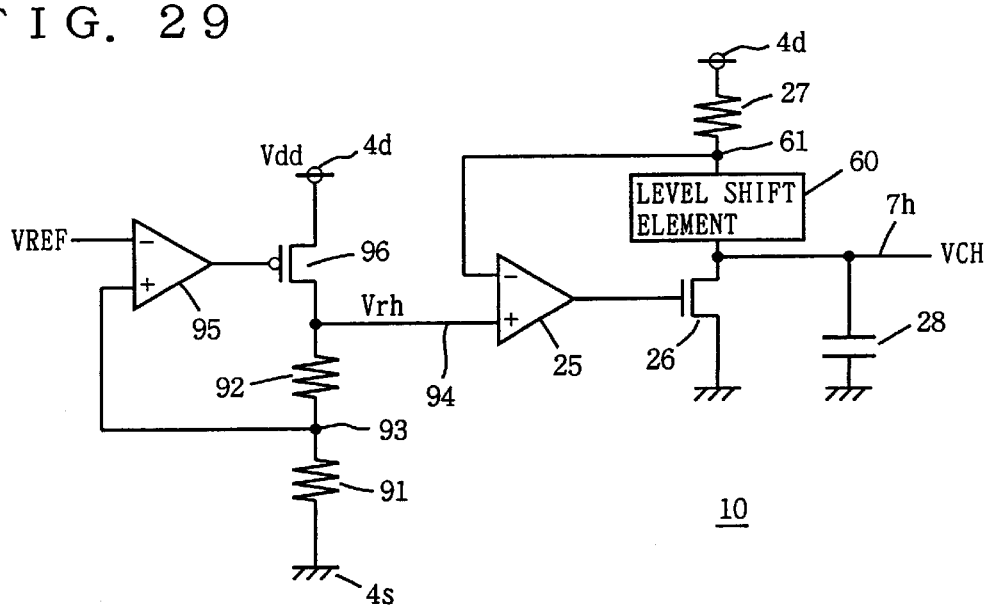
FIG. 29 illustrates the structure of a modification 1 of the embodiment 11 of the present invention.

FIG. 29 illustrates the structure of a modification of the embodiment 11 of the present invention, and specifically shows the structure of a circuit generating a bias voltage VCH for clamping an overshoot voltage. Referring to FIG. 29, a bias voltage generation circuit 10 includes resistive elements 92 and 91 serially connected between a reference voltage transmission line 94 and a ground node 4s, a comparator 95 comparing the voltage on a connection node 93 between the resistive elements 92 and 91 with a reference voltage VREF, a p-channel MOS transistor 96 supplying a current from a power supply node 4d to the reference voltage transmission line 94 in accordance with an output signal of the comparator 95, a level shift element 60 shifting up the level of a signal on a bias voltage transmission line 7h, a comparator 25 comparing a voltage on a node 61 with a reference voltage Vrh, an n-channel MOS transistor 26 discharging a current from the bias voltage transmission line 7h to the ground node 4s in accordance with an output signal of the comparator 25, a resistive element 27 connected between the power supply node 4d and the node 61, and a capacitive element 28 for stabilizing the bias voltage VCH. The comparator 25, the n-channel MOS transistor 26, the level shift element 60, the resistive element 27 and the stabilizing capacitive element 28 are identical in structure to those shown in FIG. 22.

In the bias voltage generation circuit 10 shown in FIG. 29, the comparator 95 controls the p-channel MOS transistor 96 such that the voltage V(93) on the node 93 is equal to the reference voltage VREF. Therefore, the reference voltage Vrh is expressed as follows:

$$Vrh = VREF \cdot (R91 + R92)/R91$$

The comparator 25 adjusts the level of the bias voltage VCH such that the reference voltage Vrh is equal to the voltage from the level shift element 60. Therefore, the bias voltage VCH is expressed as follows:

$$VCH = Vrh - Vf$$

where Vf represents a voltage drop of the level shift element 60. Substituting the expression of the reference voltage Vrh in the above expression, the bias voltage VCH is expressed as follows:

$$VCH = VREF + VREF \cdot R92/R91 - Vr$$

A clamping element clamping an overshoot voltage has a P-N junction built-in voltage Vf and is rendered conductive when the signal SIG is higher than the bias voltage VCH by the voltage Vf, for clamping the signal SIG. Therefore, the clamping level for the overshoot voltage is expressed as follows:

$$VREF + VREF \cdot R92/R91$$

Figure 30:
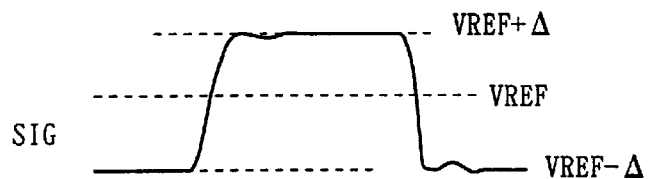
FIG. 30 is a signal waveform diagram respecting a clamping operation in the semiconductor device according to the embodiment 11 of the present invention.

As shown in FIG. 30, the clamping level for the overshoot voltage of the signal SIG is set at VREF+Δ and that for the undershoot voltage is set at VREF−Δ. Thus, signals of the same amplitude are generated on upper and lower sides with reference to the reference voltage VREF. The bias voltage generation circuit 10 shown in FIG. 27 or 29 implements the clamping of the signal SIG shown in FIG. 30. In order to equalize the amplitudes of the high-level signal and the low-level signal with each other, the following expression may be satisfied:

$$(Vdd - VREF) \cdot R82/R81 = VREF \cdot R92/R91$$

Assuming that the reference voltage VRF is half the power supply voltage Vdd, the following expression is obtained:

$$R82/R81 = R92/R91$$

Therefore, the upper and lower signal amplitudes can be equalized with each other with reference to the reference voltage VREF by equalizing the resistance ratio between the resistive elements 81 and 82 with that between the resistive elements 91 and 92. This amplitude adjustment can be implemented by appropriately adjusting the resistance values of the resistive elements 81, 82, 91 and 92.

Figure 31:
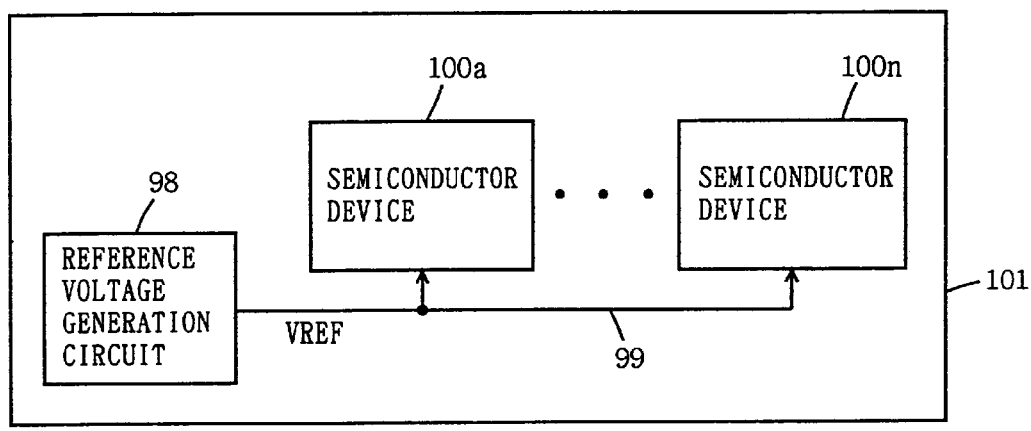
FIG. 31 schematically illustrates the structure of a system according to the embodiment 11 of the present invention.

FIG. 31 schematically illustrates the structure of a system employing the semiconductor device. Referring to FIG. 31, semiconductor device (integrated circuits) 100*a* to 100*n* are arranged on a printed circuit board 101. A reference voltage VREF from a reference voltage generation circuit 98 is supplied to the semiconductor devices 100*a* to 100*n* in common through a reference voltage transmission line 99. High/low levels of input signals are determined in the semiconductor devices 100*a* to 100*n* with reference to the reference voltage VREF, and output signals are outputted also with reference to the reference voltage VREF. Therefore, the amplitude of a signal SIG can be determined in each of the semiconductor devices 100*a* to 100*n* by utilizing the reference voltage VREF from the reference voltage generation circuit 98 provided outside the semiconductor devices 100*a* to 100*n*, for suppressing an overshoot/undershoot voltage and limiting the amplitude of the signal SIG.

In order to adjust the overshoot/undershoot voltage in high accuracy, the resistance values of the resistive elements 81, 82, 91 and 92 may be adjusted by laser blowing of a fuse element or the like.

The reference voltage generation circuit 98 is provided outside the semiconductor devices 100*a* to 100*n* in common. Alternatively, the reference voltage generation circuit 98 may be provided in one of the semiconductor devices 100*a* to 100*n* so that the reference voltage VREF from the reference voltage generation circuit 98 is utilized by semiconductor devices 100*a* to 100*n* provided on the printed circuit board 101.

As hereinabove described, the embodiment 11 of the present invention adjusts the level of a bias voltage using a reference voltage representing the reference for a high/low level of a signal and a shift voltage shifted by a level shift element, whereby temperature dependency of a P-N junction built-in voltage of a clamping element can be canceled by the shift voltage, an overshoot or undershoot voltage can be correctly suppressed also in a signal changing relative to the reference voltage, and the signal amplitude can also be limited.

[Embodiment 12]

Figure 32:
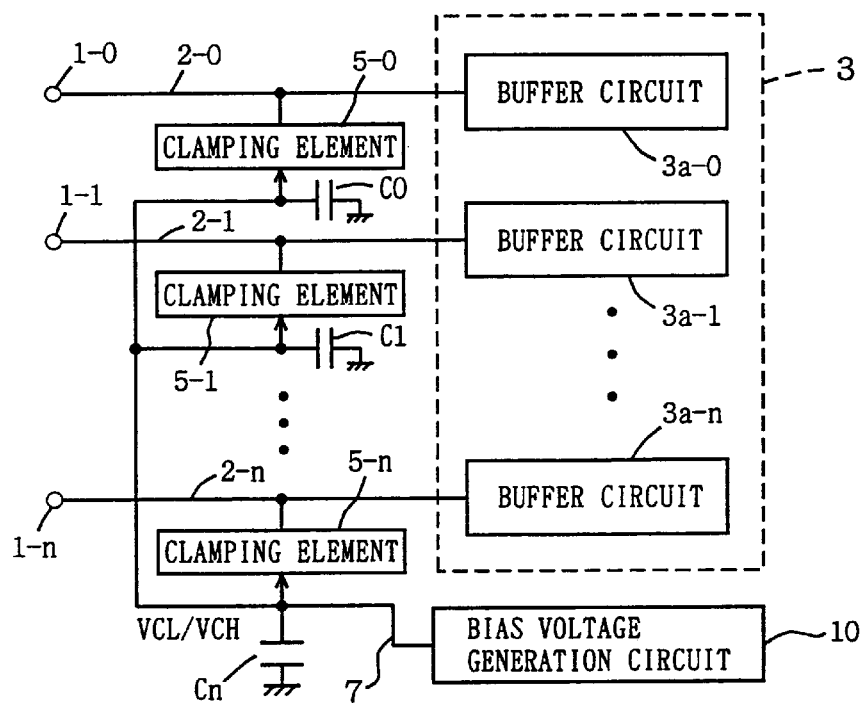
FIG. 32 schematically illustrates the structure of a main part of a semiconductor device according to an embodiment 12 of the present invention.
Figure 33:
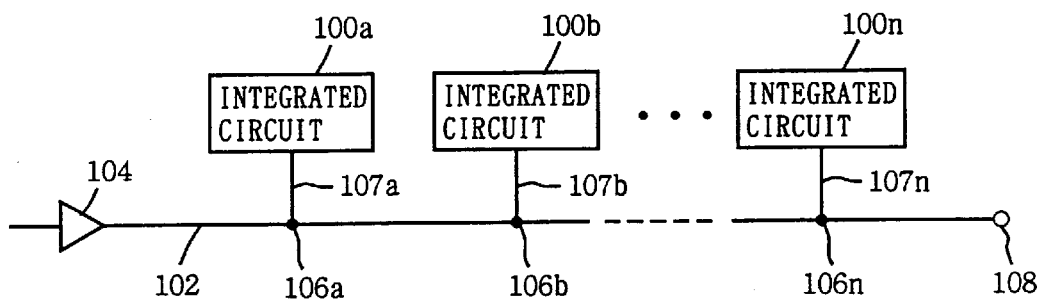
FIG. 33 schematically illustrates the overall structure of a conventional semiconductor integrated circuit device.
Figure 34:
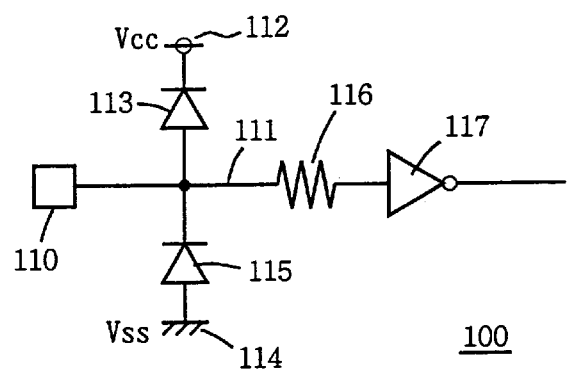
FIG. 34 schematically illustrates the structure of a conventional input protection circuit.
Figure 35:
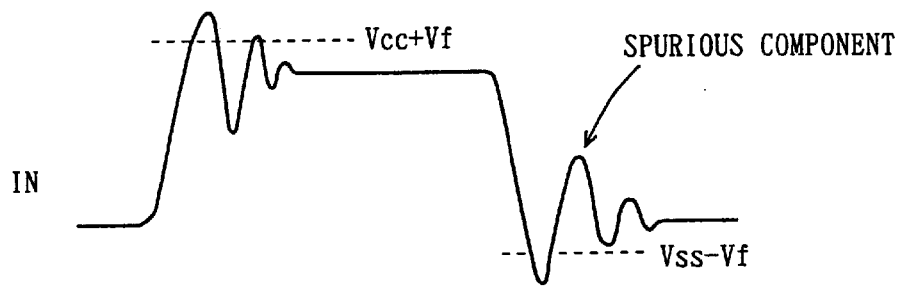
FIG. 35 is a signal waveform diagram respecting operations of the input protection circuit shown in FIG. 34.

FIG. 32 schematically illustrates the structure of a semiconductor device according to an embodiment 12 of the present invention. Referring to FIG. 32, an internal circuit 3 includes buffer circuits 3*a*-0 to 3*a*-n coupled to pads 1-0 to 1-n through signal lines 2-0 to 2-n respectively. Clamping elements 5-0 to 5-n are coupled to the signal lines 2-0 to 2-n respectively. A bias voltage VCL/VCH from a bias voltage generation circuit 10 is transmitted to the clamping elements 5-0 to 5-n through a bias voltage transmission line 7 in common. Capacitive elements C0 to Cn for stabilizing the bias voltage VCL/VCH on the bias voltage transmission line 7 are arranged in correspondence to the clamping elements 5-o to 5-n, respectively.

The buffer circuits 3*a*-0 to 3*a*-n are generally arranged at regular intervals. Therefore, the bias voltage transmission line 7 from the bias voltage generation circuit 10 employed for the buffer circuits 3*a*-0 to 3*a*-n in common has a certain length for transmitting the bias voltage VCL/VCH to the clamping elements 5-o to 5-n. In general, such a line has parasitic resistance. An overshoot/undershoot is a signal having a width of several ns, and changes at a high speed. Therefore, line resistance on the bias voltage transmission line 7 may delay supply of the bias voltage VCL/VCH from the bias voltage generation circuit 10. In other words, it may occur that the bias voltage generation circuit 10 cannot accommodate change of the overshoot/undershoot at a high speed to correctly absorb the overshoot/undershoot voltage. In this case, fluctuation of the bias voltage VCL/VCH following occurrence of the overshoot/undershoot can be suppressed at a high speed with no influence from the line resistance of the bias voltage transmission line 7 by arranging the capacitive elements C0 to Cn in proximity to the clamping elements 5-0 to 5-n, respectively. Thus, a semiconductor device capable of absorbing an overshoot/undershoot voltage at a high speed and stably clamping the signal lines at a desired voltage level can be implemented.

The clamping elements 5-0 to 5-n may be those clamping both overshoot and undershoot voltages, those damping the undershoot voltage, or those clamping the overshoot voltage.

The buffer circuits 3a-0 to 3a-n may be input buffer circuits, output buffer circuits, or input/output buffer circuits.

The capacitive elements C0 to Cn, which are provided adjacently to the clamping elements 5-0 to 5-n respectively, may alternatively be arranged in proximity to the clamping elements 5-0 to 5-n respectively in correspondence to the buffer circuits 3a-0 to 3a-n respectively. The capacitive elements C0 to Cn may simply suppress fluctuation of the level of the bias voltage VCL/VCH for the clamping elements 5-0 to 5-n respectively.

As hereinabove described, the embodiment 12 of the present invention provides a bias voltage transmission line with stabilizing capacitive elements in correspondence to a plurality of clamping elements provided in parallel with each other respectively, whereby a voltage on a corresponding signal line can be correctly clamped at a prescribed voltage level in high-speed response after generation of an overshoot/undershoot voltage.

[Other Applications]

The semiconductor device may be a memory LSI, or a processing circuit such as a logic circuit or a processor.

If a memory and a logic circuit or a processor are formed on a single semiconductor chip, an overshoot/undershoot may be caused when a signal of a small amplitude is transmitted at a high speed. In a memory LSI mixed with a processor/logic circuit, a line for transmitting a signal between the processor/logic circuit and the memory has a relatively long length particularly in case of data). Therefore, the present invention is also applicable to such a semiconductor device.

A P-N junction or bipolar transistor is employed as a clamping element in the present invention. Alternatively, a MOS transistor may be employed as the clamping element. In this case, an npn bipolar transistor may be replaced with an n-channel MOS transistor, a pnp bipolar transistor may be replaced with a p-channel MOS transistor, and a P-N junction built-in voltage may be replaced with the absolute value of a threshold voltage thereof.

According to the present invention, as hereinabove described, the amplitude of an overshoot/undershoot voltage can be reduced, an internal circuit or a receiving circuit can be made free from adverse influence from an overshoot/undershoot, and a signal can be transferred at a high speed. When a clamping bias voltage is generated, the clamping voltage can be held at a constant voltage level over a wide temperature range by generating the voltage canceling influence by a built-in voltage of a clamping transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
 a signal line;
 a first transistor having a first conduction node connected to said signal line, a second conduction node receiving a voltage at a first power source node and a control electrode node, said first transistor having a well region of a second conductivity type formed on a surface of a substrate region of a first conductivity type, a first impurity region of said first conductivity type formed in said well region and coupled to said first conduction node a second impurity region of said second conductivity type formed in said well region and connected to said control electrode node, and a third impurity region of said first conductivity type formed in said well region between said first and second impurity regions and spaced apart therefrom and connected to said second conduction node; and
 a control bias voltage generation circuit coupled to said control electrode node for applying a bias voltage different in level from the voltage of said first power source node to said control electrode node.

2. The semiconductor device in accordance with claim 1, wherein said substrate region is a well region formed on a surface of a substrate layer of said second conductivity type.

3. The semiconductor device in accordance with claim 1, wherein said first conductivity type is an n type, and said second conductivity type is a p type.

4. The semiconductor device in accordance with claim 1, wherein said first conductivity type is a p type, and said second conductivity type is an n type.

5. The semiconductor device in accordance with claim 1, further comprising
 a second transistor having a first conduction node connected to said signal line, a second conduction node receiving a voltage at a second power source node and a control electrode node, said second transistor having another well region of said first conductivity type formed on a surface of a substrate region of said second conductivity type, a fourth impurity region of said second conductivity type formed on said surface of the other well region and coupled to said first conduction node of said second transistor, a fifth impurity region of said first conductivity type formed on said other well region and connected to said control electrode node of said second transistor and a sixth impurity region of said second conductivity type formed on said surface of said other well region between the fourth and fifth impurity regions spacedly apart therefrom and connected to said second conduction node of said second transistor, and
 a second bias voltage generation circuit coupled to said control electrode node of said second transistor for applying a second bias voltage different in level from the voltages of the first and second power source supply nodes to said control electrode node of said second transistor.

6. The semiconductor device in accordance with claim 1, wherein said control bias voltage generation circuit includes:
 a reference voltage generation circuit for generating a reference voltage,
 a compare circuit for comparing said bias voltage with said reference voltage, and
 a current drive transistor for causing a flow of a current between a second power supply node and a bias voltage transmission line transmitting said bias voltage in accordance with an output signal from said compare circuit.

7. The semiconductor device in accordance with claim 6, wherein said reference voltage generation circuit includes:
 a circuit for generating a comparison voltage, and
 a diode element connected between an output node of the comparison voltage generation circuit and a node for outputting said reference voltage, and
 the absolute value of the difference between said comparison voltage and said reference voltage is equal to a forward voltage drop of said diode element.

8. The semiconductor device in accordance with claim 6, wherein said compare circuit includes:
- a diode element for shifting down a level of said bias voltage by a forward voltage drop thereof, and
- a differential amplifier for differentially amplifying said reference voltage and said bias voltage level-shifted by said diode element and applying an output signal thereof to a control electrode node of said current drive transistor.

9. The semiconductor device in accordance with claim 6, wherein said reference voltage generation circuit includes:
- a circuit for generating a comparison voltage, and
- a diode element for shifting down said comparison voltage by a forward voltage drop thereof for generating said reference voltage.

10. The semiconductor device in accordance with claim 6, wherein said compare circuit includes:
- a diode element for shifting up the level of said bias voltage by a forward voltage drop thereof, and
- a differential amplifier for differentially amplifying said bias voltage level-shifted by said diode element and said reference voltage and applying an output signal thereof to a control electrode node of said current drive transistor.

11. The semiconductor device in accordance with claim 1, wherein said control bias voltage generation circuit includes:
- a series body having a diode element and a diode-connected insulated gate field effect transistor coupled in series between a first node and a second node receiving a constant voltage, and
- a source follower transistor of the same conductivity type as said diode-connected insulated gate field effect transistor, receiving a voltage of said first node of said series body and operating in a source-follower mode for generating said bias voltage.

12. The semiconductor device in accordance with claim 11, wherein a voltage higher than said constant voltage by the sum of a forward voltage drop of said diode element and an absolute value of a threshold voltage of said diode-connected insulated gate field effect transistor is produced at said first node.

13. The semiconductor device in accordance with claim 11, wherein a voltage lower than said constant voltage by the sum of a forward voltage drop of said diode element and an absolute value of a threshold voltage of said diode-connected insulated gate field-effect transistor is produced at said first node.

14. The semiconductor device in accordance with claim 11, wherein a back gate of said diode-connected insulated gate field effect transistor is connected to said first node, and a back gate of said source-follower transistor is connected to an output node for said bias voltage.

15. The semiconductor device in accordance with claim 1, wherein said control bias voltage generation circuit includes:
- a circuit for generating a comparison voltage,
- a level shift circuit for shifting a level of a voltage at a first node,
- a circuit for comparing said comparison voltage with a voltage outputted from said level shift circuit for adjusting the voltage of said first node in accordance with the result of comparison,
- a diode element for shifting the level of said bias voltage in a direction opposite to a voltage shifting direction in said level shift circuit, and
- a compare circuit for comparing said bias voltage level-shifted by said diode element with the voltage of said first node for adjusting the level of said bias voltage in accordance with the result of comparison.

16. The semiconductor device in accordance with claim 7, wherein said diode element is identical in structure to said first transistor.

17. The semiconductor device in accordance with claim 1, wherein said signal line is provided in plurality in parallel with each other, said first transistor is provided in correspondence to each respective signal line, and said control bias voltage generation circuit is provided in common to the first transistors provided in plurality, and wherein
said semiconductor device further comprises;
- a bias voltage transmission line for transmitting said bias voltage to the first transistors, and
- a plurality of capacitive elements provided on said bias voltage transmission line in correspondence to said first transistors respectively.

18. The semiconductor device in accordance with claim 11, wherein said diode element is identical in structure to said first transistor.

19. The semiconductor device in accordance with claim 15, wherein said diode element is identical in structure to said first transistor.

* * * * *